(12) United States Patent
Hiraki et al.

(10) Patent No.: US 6,324,103 B2
(45) Date of Patent: Nov. 27, 2001

(54) SEMICONDUCTOR INTEGRATED CIRCUIT DEVICE, MEMORY MODULE, STORAGE DEVICE AND THE METHOD FOR REPAIRING SEMICONDUCTOR INTEGRATED CIRCUIT DEVICE

(75) Inventors: Mitsuru Hiraki, Kodaira; Shoji Shukuri, Koganei, both of (JP)

(73) Assignee: Hitachi, Ltd., Tokyo (JP)

(*) Notice: Subject to any disclaimer, the term of this patent is extended or adjusted under 35 U.S.C. 154(b) by 0 days.

(21) Appl. No.: 09/756,233

(22) Filed: Jan. 9, 2001

Related U.S. Application Data

(62) Division of application No. 09/497,119, filed on Feb. 3, 2000, which is a division of application No. 09/435,035, filed on Nov. 5, 1999, now Pat. No. 6,201,733.

(30) Foreign Application Priority Data

Nov. 11, 1998 (JP) ................................................. 10-320962

(51) Int. Cl.[7] ..................................................... G11C 16/04
(52) U.S. Cl. ................ 365/189.05; 365/195; 365/230.08
(58) Field of Search ......................... 365/185.08, 189.05, 365/189.12, 195, 194, 200, 185.33, 230.08

(56) References Cited

U.S. PATENT DOCUMENTS

| | | | |
|---|---|---|---|
| 5,671,180 | 9/1997 | Higuchi | 365/185.21 |
| 5,694,359 | 12/1997 | Park | 365/185.09 |
| 5,812,468 | 9/1998 | Shirley | 365/200 |
| 6,003,133 | 12/1999 | Moughanni et al. | 713/200 |
| 6,023,761 | 2/2000 | Ott | 713/1 |

*Primary Examiner*—Richard Elms
*Assistant Examiner*—Hien Nguyen
(74) *Attorney, Agent, or Firm*—Antonelli, Terry, Stout & Kraus, LLP

(57) ABSTRACT

To improve the efficiency for repairing a defect of a large-scale integrated circuit. A semiconductor integrated circuit device comprises, a central processing unit (10), an electrically reprogrammable nonvolatile memory (11) and a volatile memory (12, 13) while sharing a dat bus (16), and utilizes the stored information of the nonvolatile memory so as to repair a defect of the volatile memory. This volatile memory includes volatile storage circuit (12AR, 13AR) for latching the repair information for repairing a defective normal memory cell with a redundancy memory cell. The nonvolatile memory reads out the repair information from itself in response to an instruction to initialize the semiconductor integrated circuit device. In response to the initializing instruction, the volatile storage circuit latches the repair information from the nonvolatile memory. Any fuse program circuit is not needed for the detect repair, but a defect to occur after a burn-in can be newly repaired so that the new defect can be repaired even after the packaging over a circuit substrate.

10 Claims, 22 Drawing Sheets

SEMICONDUCTOR INTEGRATED CIRCUIT DEVICE, MEMORY MODULE, STORAGE DEVICE AND THE METHOD FOR REPAIRING SEMICONDUCTOR INTEGRATED CIRCUIT DEVICE

CROSS-REFERENCE TO RELATED APPLICATION

This application is a Divisional application of application Ser. No. 09/497,119, filed Feb. 3, 2000, which is a Divisional application of application Ser. No. 09/435,035, filed Nov. 5, 1999, now U.S. Pat. No. 6,201,733.

BACKGROUND OF THE INVENTION

The present invention relates to a semiconductor integrated circuit device in which a volatile memory, such as a DRAM (Dynamic Random Access Memory) or a SRAM (Static Random Access Memory), and an electrically rewritable or reprogrammable nonvolatile memory, such as a flash memory, are packaged together with a control processing unit, such as a central processing unit, over a semiconductor substrate; and, more particularly, the invention relates to a repair technique which is effective when applied to an on-chip type large-scale integrated circuit, such as a DRAM-consolidated LSI (Large-Scale Integration), a DRAM-embedded LSI or a system LSI.

Nowadays, the large scale of a semiconductor integrated circuit device is in the category of a system on-chip, such as a DRAM-consolidated LSI, a DRAM-embedded LSI or a system LSI.

As a semiconductor integrated circuit device is provided with a larger scale, its internal defects can be less ignored. Especially, a memory, such as a DRAM, a SRAM or a flash memory, is expected to have a relatively small area, but a large storage capacity, so that it becomes susceptible to defects caused by the remarkably fine working during manufacture and the resultant miniaturization of signals. Therefore, the application of a redundancy circuit technique to such semiconductor circuit devices is important so that an expected system operation can be achieved irrespective of the occurrence of more or less defects.

For enlarging the scale of a semiconductor integrated circuit device, it is frequently desirable to apply a trimming technique for achieving the desired circuit characteristics. By this trimming technique, an analog amount, such as an internal voltage or current, and a quasi-analog amount, such as the timing of a timing signal, can be sufficiently brought to a desired value irrespective of the manufacturing dispersion of the semiconductor integrated circuit device.

The redundancy circuit technique and the trimming technique for a large-scale semiconductor integrated circuit device are well-known. One such technique is disclosed in Japanese Patent Laid-Open No. 334999/1995, and in corresponding U.S. Pat. No. 5,561,627, of Hitachi, Ltd., and is used in a program for providing defect repair information using the memory cells of an electrically reprogrammable nonvolatile memory, such as a flash memory. In this technique, repair information specifying a defective memory cell in the nonvolatile memory is stored in the memory cell of the nonvolatile memory; the repair information is latched in an internal latch circuit at the time of initialization; and the latched repair information and an access address are compared so that the access is replaced, in the case of coincidence, by the access to a redundant memory cell.

On the other hand, another technique is disclosed in Japanese Patent Laid-Open No. 214496/1998, and in corresponding U.S. patent application No. 09/016,300, of Hitachi, Ltd., and in which trimming information is stored for use in the storage region of a portion of a nonvolatile memory, such as a flash memory. In accordance with this technique, more specifically, there is provided a trimming circuit for finely adjusting the output clamp voltage of voltage clamp means for providing an operating power source for the flash memory so that the trimming information for determining the state of the timing circuit is programmed in the memory cells of the flash memory. The programmed trimming information is read out in a reset operation from the flash memory and is internally transferred to a register. The state of the trimming circuit is determined by using the transferred trimming information. As a result, the clamp voltage to be outputted from voltage clamp means is trimmed to a value suitable for the operation of the flash memory, thereby compensating for the manufacturing dispersion of the semiconductor integrated circuit device.

An example of a system LSI is described on pp. 34 to 38 of "Electronic Materials" (issued in January, 1998, by Kabushiki Gaisha Kogyo Chosakai), wherein, as seen in FIG. 4 thereof, a volatile memory, such as a flash memory, and a DRAM are consolidated together with a CPU (Central Processing Unit). The technique for forming the nonvolatile memory and the DRAM by a common process is already described in U.S. Pat. No. 5,057,448. On the other hand, examples of a semiconductor integrated circuit device packaging a flash memory and a DRAM together with a CPU on one semiconductor substrate are described in Japanese Patent Laid-Open Nos. 52293/1989 and 124381/1998.

SUMMARY OF THE INVENTION

Our preceding patent application has proposed the use of storage elements of one flash memory for repairing a defect or to effect trimming within a closed range of the flash memory. In view of the large-scale integration represented by a system on-chip, we have investigated the efficient use of a nonvolatile memory, or one circuit module packaged in the large-scale integrated circuit device in relation to another circuit module. In the course of this investigation, we have considered the utilization of the stored information of the nonvolatile memory to repair a defect of a volatile memory, other than the nonvolatile memory itself we have recognized the following new problems in the investigation of such repair of a volatile memory.

In order to provide the nonvolatile memory with the required repair information, more specifically, a procedure is needed to reflect the repair information on the volatile memory. This reflection of the information desirably should be realized at a high speed, even if the amount of repair information increases, to cope with an increase in the defects in accordance with the construction of the volatile memory or the provision of a large storage capacity.

In studies subsequent to that investigation, Japanese Patent Laid-Open No. 131897/1994 has been found, in which it is proposed to use a programmable ROM for repairing a defect in the cache memory. However, the programmable ROM in this case is a dedicated circuit element belonging to a redundancy memory control circuit in the cache memory, but represents no more than a repairing technique in the closed range of the cache memory, and has failed to adequately address our aforementioned problems, even if it is resultantly compared.

An object of the present invention is to provide a semiconductor integrated circuit device which is capable of improving the changing efficiency of a coupling change, such as a defect repair, in a circuit having a large scale logic construction, in which a nonvolatile memory made accessible by a control processing device and a volatile memory are packaged.

Moreover, an object of the present invention is to realize a cost by improving the yield of a semiconductor integrated circuit device which has been strictly demanded to have a lower cost because of its large-scale logic.

Another object of the present invention is to improve the usability of a memory module by consolidating the specifications of the defect repair of the memory module in a semiconductor integrated circuit device having a volatile memory, such as a DRAM or a SRAM, as the memory module.

Still another object of the present invention is to provide a data storage device in which there is stored design data to be used for designing a semiconductor integrated circuit device by using a computer.

The foregoing and other objects and novel features of the invention will become more apparent from the following description when taken with reference to the accompanying drawings.

Representative aspects of the invention to be described herein will be briefly summarized in the following.

A first semiconductor integrated circuit device (1A, 1C) according to the invention comprises, over one semiconductor substrate: an electrically reprogrammable nonvolatile memory (11) capable of being accessed by a control processing device (10), such as a central processing unit; and a volatile memory (12, 13) capable of being accessed by the control processing device, so that the stored information of the nonvolatile memory may be utilized for a connection change to effect a defect repair of the volatile memory. Specifically, the volatile memory includes: a plurality of first volatile memory cells, such as normal volatile memory cells, and a plurality of second volatile memory cells, such as redundancy volatile memory cells; and a volatile storage circuit (12AR, 13AR) for holding coupling control information for enabling the first volatile memory cells to be replaced by the second volatile memory cells. The nonvolatile memory includes a plurality of nonvolatile memory cells, some of which are used for storing coupling control information, so that the coupling control information is read out from the nonvolatile memory cells and outputted by the reading and setting operations of the coupling control information, such as an instruction to initialize the semiconductor integrated circuit device. The volatile storage circuit is caused to fetch and store the coupling control information from the nonvolatile memory by the reading and setting operations.

A second semiconductor integrated circuit device (1B) according to the invention additionally utilizes the stored information of a nonvolatile memory for repairing a defect of the nonvolatile memory. Specifically, the volatile memory includes: a plurality of normal volatile memory cells and a plurality of redundancy volatile memory cells; and a volatile storage circuit (12AR, 13AR) for holding the repair information for repairing a defective normal volatile memory cell by replacing it with one of the redundancy volatile memory cells. The non-volatile memory includes: a plurality of normal nonvolatile memory cells and a plurality of redundancy nonvolatile memory cells; and a volatile storage circuit (11AR) for holding the repair information for repairing a defective normal nonvolatile memory cell by replacing it with one of the redundancy nonvolatile memory cells.

Some of the nonvolatile memory cells are memory cells for storing the information needed for repair of the volatile memory and the information needed for repair of the nonvolatile memory. The repair information, as stored in some nonvolatile memory cells, is read out from the nonvolatile memory cells by executing reading and setting operations, such as an operation to initialize the semiconductor integrated circuit device, and is fed to and held in the volatile storage circuit in the volatile memory and the volatile storage circuit in the nonvolatile memory.

According to the first and second semiconductor integrated circuit devices, the information for coupling control, such as defect repair, is programmed in the nonvolatile memory in place of elements, such as the fuse elements, so that the fuse program circuit, the might otherwise be needed for using the fuse elements, can be eliminated. Accordingly, the use or step in the manufacture of an apparatus, which is liable to have a relatively high price, such as a laser cutting apparatus for cutting a fuse, can be eliminated to lower the cost of manufacture. When the fuse elements are provided, they need to be positioned at a relatively high layer portion over the semiconductor substrate so that they can be cut even in the presence of a layer which makes the fuse cutting difficult, such as an aluminum wiring layer to be used for wiring the semiconductor integrated circuit device or a copper wiring provided to make the signal propagation delay time shorter. For this structural reason and for avoiding thermal damage to an insulating film or surface protecting film covering the semiconductor substrate surface by a laser beam used to cut the fuse, an opening for the laser exposure has to be formed in the insulating film or the surface protecting film over the fuse elements. Because such a complicated manufacturing process is required, the semiconductor integrated circuit device itself has a high price. In addition, when the fuse elements are provided, their size reduction is restricted by the need to provide openings for the laser exposure, so that the semiconductor substrate takes on a relatively large size. If the fuse program circuit is not used, the manufacturing process is simplified. When a nonvolatile memory is utilized for storing the coupling control information, it is possible to enjoy an advantage in the information can be reprogrammed at an arbitrary time and several times. This makes it possible to sufficiently cope with the coupling change for a defect which occurs at a relatively later step in the manufacturing process, such as the burn-in step in the manufacture of the semiconductor integrated circuit device, or a coupling change for a defect which occurs after the packaging over the system or the circuit substrate has aged. As a result, a circuit having a large-scale logic construction, in which a volatile memory is packaged together with a nonvolatile memory, can be sufficiently utilized because it can be changed after manufacture. Therefore, a cost reduction can be realized by improving the yield of the semiconductor integrated circuit device having large-scale logic.

The data input terminals of the individual volatile storage circuits (11AR, 12AR, 13AR) are coupled to a data bus (16) with which the individual data input/output terminals of the nonvolatile memory and the volatile memory are commonly connected, so that the coupling control information outputted from the nonvolatile memory can be transmitted through the data bus to the corresponding volatile storage circuit by the operations to read out and set the coupling control information, such as the initialization produced by the control processing device, such as the central processing unit. As a result, the general-purpose utility of the nonvolatile memory can be warranted with respect to access to the nonvolatile memory by the control processing device.

If there is adopted a construction in which the volatile storage circuit in the volatile memory is connected with the data bus, no consideration need be given to the addition of special wiring lines for transmitting the coupling control information, such as the repair information, even when the number of volatile memories is increased.

If the bit number of the entire coupling control information is less than that of the data bus, the coupling control information may be programmed in parallel in all the volatile storage circuits by connecting the signals lines of the data bus separately with the data input terminals of the individual volatile storage circuits.

When the scale of the semiconductor integrated circuit device is large, the frequency of coupling changes against defects is accordingly increased to raise the probability of increasing the coupling control information. When the data bus width, i.e., the bit number of the data bus is small for the increased coupling control information, the individual volatile storage circuits can be programmed in series with the coupling control information. In this case, when the coupling control information is consecutively read out in a plurality of divided cycles from the nonvolatile memory cells and outputted to the data bus in response to a setting operation instruction, such as an instruction to initialize the semiconductor integrated circuit device, the coupling control information to be fed for each reading cycle through the data bus may be consecutively fetched and held for each of the reading cycles by the volatile storage circuit.

Especially in view of the large-scale integration represented by the system on-chip, the following items will become apparent. More specifically, in order that the nonvolatile memory, or one circuit module or memory module packaged on the large-scale integrated circuit device, may be efficiently utilized in relation to another circuit module or memory module, the stored information of the nonvolatile memory is utilized for coupling control, such as a defect repair of a volatile memory other than the nonvolatile memory. In this case, the means for effecting transfer of the coupling control information through the data bus and the series internal transfer of the plurality of cycles of the coupling control information is excellent in that, when the information or an objective of the coupling control, such as a defect, increases with an increase in the capacity of the volatile memory, the process to reflect the control information on the individual volatile memories in accordance with an increase in the amount of control information can be realized at a high speed.

In order to program the volatile storage circuit with the coupling control information using a simple construction, the volatile storage circuit may hold the coupling control information outputted from the nonvolatile memory, in response to a first state indicating the reset period of a reset signal (RESET) instructing the initialization of the semiconductor integrated circuit device, and the control processing device may start a reset exceptional operation in response to the change of the reset signal from the first state to a second state indicating the release or end of reset. In this case, the reset signal has to be kept in the first state for the period necessary for programming the coupling control information. In other words, the reset release timing by the reset signal should not be premature.

In order to provide a sufficient time for programming of the coupling control information without any substantial restriction on the reset release timing of the reset signal, there can be provided a clock control circuit (19, 20) which is initialized in response to the first state (or reset period) of the reset signal (RESET) instructing the initialization of the semiconductor integrated circuit device. In response to the change of the reset signal from the first state to the second state, the clock control circuit causes the volatile storage circuit to fetch and hold the coupling control information from the nonvolatile memory, and then the central processing unit is allowed to start the reset exceptional operation.

Since the nonvolatile memory is reprogrammable, the coupling control information programmed in advance may accordingly be erroneously programmed. In order to exclude this disadvantage as much as possible, it is advisable to allow the nonvolatile memory to be set by a mode bit (MB2) to an operation mode to allow the reprogramming of the nonvolatile memory cells for storing the repair information and to an operation mode to inhibit the reprogramming.

On the other hand, it is also possible to set by a mode bit (MB1) an operation mode to allow the reprogramming of the nonvolatile memory cells by a write device connected to the outside of the semiconductor integrated circuit device, and an operation mode to allow the reprogramming of the nonvolatile memory cells in accordance with the execution of an instruction by the central processing unit. Then, the coupling control information can be programmed either on a packaged board (or on-board) or by the write device. In order to easily realize the coupling change corresponding to a defect which will occur after the packaging of the semiconductor integrated circuit device, it is desired to support the on-board programming mode.

In order to update the coupling control information, such as a demand for repairing a defect due to the on-board programming, the nonvolatile memory may store a diagnostic program. The diagnostic program causes the central processing unit to execute operations to detect a defect against the nonvolatile memory and the volatile memory and to program the repair information storing nonvolatile memory cells of the nonvolatile memory with the repair information for repairing a newly defective memory cell.

A third semiconductor integrated circuit device (30) according to the present invention extends the information, as stored for use in the nonvolatile memory (11), to one other than the information used for the repair of a defect. Specifically, the semiconductor integrated circuit device (30) comprises, over one semiconductor substrate, while sharing a data bus (16): a control processing device, such as a central processing unit (10); an electrically reprogrammable nonvolatile memory (11) which is able to be accessed by the control processing device; and a volatile memory (12, 13) which is able to be accessed by the control processing device. The nonvolatile memory and the volatile memory individually include register means (11AR, 12AR, 13AR, AR, 31DR, 12DR, 13DR) having data input terminals connected with the data bus, so that their individual functions are partially determined according to the function control information set by the individually corresponding register means. The nonvolatile memory includes a plurality of nonvolatile memory cells, some of which are used for storing initialization data containing the function control information. On the other hand, the nonvolatile memory has an operation mode to allow the reprogramming of the nonvolatile memory cells for storing initialization data and an operation mode to inhibit the reprogramming, so that the initialization data are read out from the nonvolatile memory cells and outputted in response to an instruction to initialize the semiconductor integrated circuit device. In response to the instruction to initialize the semiconductor integrated circuit device, the register means fetches and holds the initialization data from the nonvolatile memory.

In this third semiconductor integrated circuit device, in order to load each register means reliably with a large amount of initialization data in response to a reset instruction, there may be provided a clock control circuit which is initialized in response to the first state of the reset signal for instructing the initialization of the semiconductor integrated circuit device. In response to the state change of the reset signal from the first state to the second state, for example, this clock control circuit outputs a first timing signal having a plurality of phases shifted in activation timing from one another, and then outputs a second timing signal for causing the control processing device to start the reset exceptional operation. In response to the activation timing of the first timing signal having a plurality of phases, the nonvolatile memory reads the initialization data consecutively in a plurality of divided cycles from the nonvolatile memory cells and outputs them to the data bus. The register means performs an input setting operation to fetch and hold the data of the data bus consecutively for all reading cycles of the initialization data from the nonvolatile memory.

The nonvolatile memory can utilize the information held by a corresponding one of the register means, as repair information for repairing defective normal nonvolatile memory cells by replacing them with redundancy nonvolatile memory cells.

The volatile memory can utilize the information held by the corresponding one of the register means, as repair information for repairing the defective normal volatile memory cells by replacing them with redundancy volatile memory cells.

The volatile memory may be constructed to include dynamic memory cells as the volatile memory cells and to utilize the information held by the register means corresponding to the volatile memory, as the control information for specifying the refresh interval of the dynamic memory cells.

The volatile memory may also be constructed to utilize the information held by the corresponding one of the register means, as control information for specifying the timing of an internal control signal.

In this third semiconductor integrated circuit device, like before, it is also possible to efficiently change the coupling of a circuit which has a large-scale logic construction having a volatile memory packaged together with a nonvolatile memory. As a result, the yield of the semiconductor integrated circuit device having the large-scale logic can be improved to realize a cost-reduction.

The nonvolatile memory is exemplified by a flash memory, and some of nonvolatile memory cells are able to store a program to be executed by the control processing device. The volatile memory is exemplified by a DRAM and can be utilized as a work memory of the control processing device. The volatile memory can be exemplified by a fast access memory in the form of a SRAM.

In a semiconductor integrated circuit device (1A, 1B, 1C) including a volatile memory (12, 13), such as a DRAM or a SRAM, as the memory module, the memory module includes a volatile storage circuit (12AR, 13AR) for storing repair information on the memory array in a volatile state. The volatile storage circuit (12AR, 13AR) includes: a plurality of input terminals or input nodes which can be coupled to the data base to be formed in the semiconductor integrated circuit device; and a control signal input terminal for receiving a control signal (reset) for an operation to set the reading of the repair information, such as an operation to initialize the semiconductor integrated circuit device. The memory module includes a plurality of first volatile memory cells, such as normal volatile memory cells, and a plurality of second volatile memory cells, such as redundancy volatile memory cells, and the volatile storage circuit (12AR, 13AR) operates to hold repair information for enabling the first volatile memory cells to-be replaced by the second volatile memory cells.

The construction is such that the repair information to be set in the volatile storage circuit (12AR, 13AR) is fed from the outside of the memory module to the volatile storage circuit (12AR, 13AR) in the memory module, and the specifications of the circuit or function relating to defect repair of the memory module packaged in the semiconductor integrated circuit device are standardized or unified. As a result, the usability of the memory module can be improved when it is sold as memory module part, i.e., an IP (intellectual Property) part.

The semiconductor integrated circuit device including a memory module is designed by a designing machine composed of a computer (or electronic computer), the design data such as the layout data for determining the construction of the volatile storage circuit (12AR, 13AR), the circuit function data or the connection data are described in such specific computer languages as can be understood by the computer. Moreover, the data is serviced as a storage device, such as the magnetic tape, a MO (Magneto-Optical disk), a CD-ROM or a floppy disk. On the other hand, the design data of the volatile storage circuit (12AR, 13AR) may be serviced while being stored in the data storage device together with the design data of the circuit functions of the memory module of the volatile memory, such as a DRAM or a SRAM. Still moreover, the design data of the volatile storage circuit (12AR, 13AR) may be stored in the data storage device while being assembled in the design data of the memory module of the volatile memory, such as a DRAM or a SRAM.

By thus storing and servicing the design data of the memory module and the semiconductor integrated circuit device containing the former as design data, as described in specific computer languages can be understood by the computer, in the storage device, it is possible to efficiently design the memory module or the semiconductor integrated circuit device containing the former.

DESCRIPTION OF THE PREFERRED EMBODIMENTS

<<First Single Chip Microcomputer>>

Figure 1:
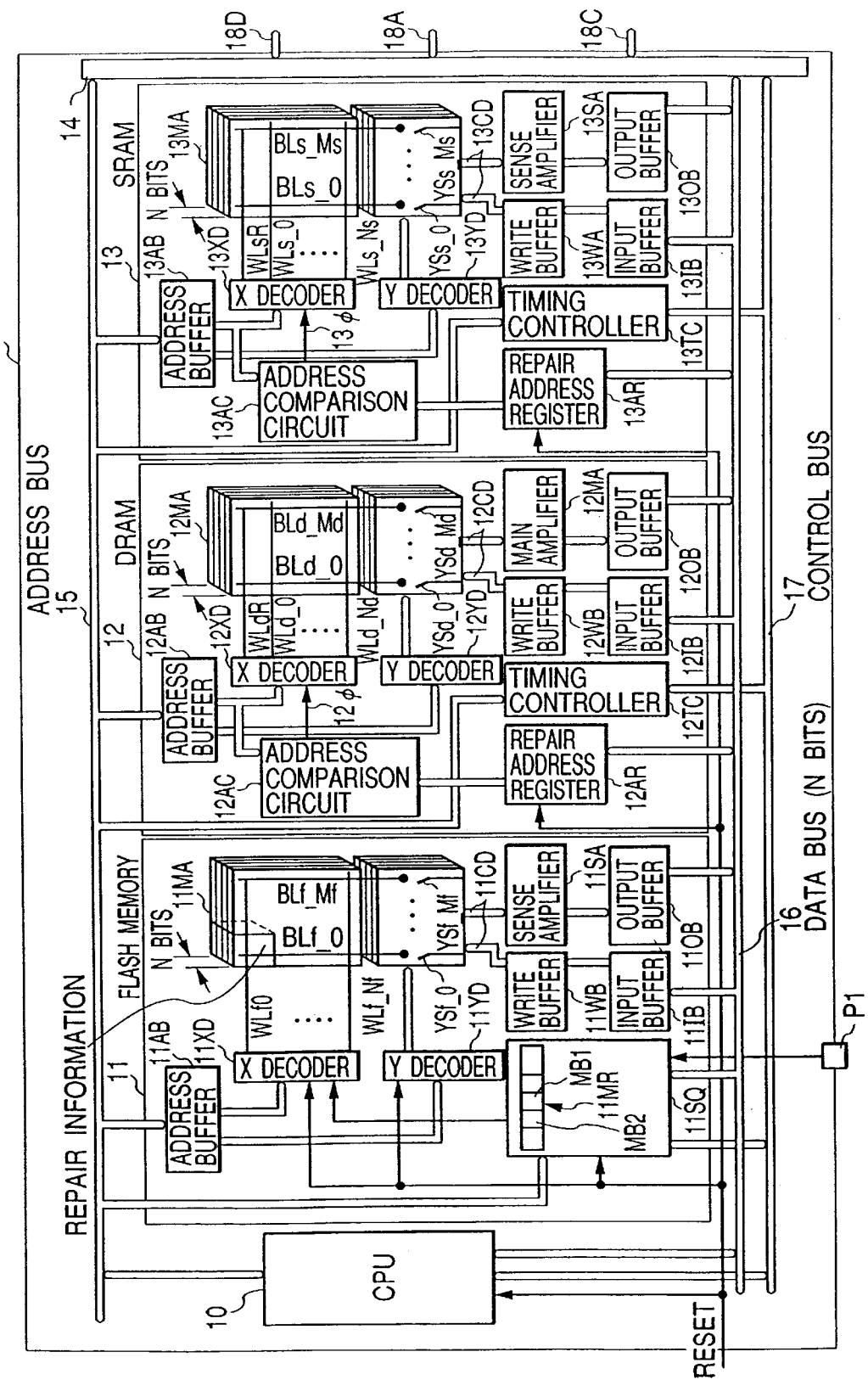
FIG. 1 is a block diagram showing a first single chip microcomputer representing one example of the semiconductor integrated circuit device of the invention.

FIG. 1 shows a first single chip microcomputer representing one embodiment of the semiconductor integrated circuit device of the invention. A single chip microcomputer 1A, as shown in FIG. 1, is formed over one semiconductor substrate made of single crystalline silicon and is positioned as an on-chip system LSI.

The single chip microcomputer 1A is constructed to include a CPU (central processing unit or control processing unit) 10, a flash memory 11, which is one example of an electrically erasable and programmable nonvolatile memory, a DRAM 12, which is one example of a volatile memory, a SRAM 13, which is another example of a volatile memory, and an input/output circuit 14, which are representatively exemplified. The individual memories 11, 12 and 13 can be deemed as memory modules. The CPU 10, flash memory 11, DRAM 12, SRAM 13 and input/output circuit 14 share an address bus 15, a data bus 16 of N bits and a control bus 17.

The input/output circuit 14 is connected with an external address bus 18A, an external data bus 18D, an external control bus 18C and so on, although the invention is not limited thereto, and the input/output circuit 14 is provided with a not-shown input/output port connected with the buses 18A, 18D and 18C, a bus controller for controlling the starts of the bus cycles for the external buses 18A, 18D and 18C, an input/output peripheral circuit represented by a serial interface circuit, and so on.

The CPU 10 is constructed, although not limitative, to include an execution unit having an arithmetic logic unit (ALU), a program counter (PC), a stack pointer (SP), a dedicated register such as status register, (SR), and a group of general-purpose registers to be used as a work area; and a control unit including an instruction register, to which there are sequentially inputted program data stored in the flash memory 11 or program instructions fed from operation system programs, and an instruction decoder for decoding the instructions stored in the instruction register, to generate control signals for the execution unit. The execution unit is coupled to the address bus 15, the data bus 16 and the control bus 17, to control the selective output of an address signal to the address bus 15, the selective output of a control signal to the control bus, and the input/output of data through the data bus. Therefore, the CPU 10 controls the operations of the semiconductor integrated circuit device as a whole in accordance with the program data stored in the flash memory 11 or the operation system programs.

The DRAM 12 is a read/write memory having a relatively large capacity to be utilized as a work memory or main memory of the CPU 10. The DRAM 12 has a capacity as large as several giga bits, for example, according to the larger scale of the system. A memory cell array 12MA of the DRAM 12 has not only normal word lines WLd_0 to WLd_Nd but also a redundancy word line WLdR. The select terminals of normal dynamic memory cells are coupled to the normal word lines WLd_0 to WLd_Nd, and the select terminal of redundancy dynamic memory cells is coupled to the redundancy word line WLdR. The constructions of the memory cells need not be made different for the normal and redundancy types. Which one of the normal word lines WLd_0 to WLd_Nd is to be replaced by the selection of the redundancy word line WLdR is determined by the repair information which is set in a repair address register 12AR. The repair row address information contained in the repair information is compared with a row address signal from an address buffer 12AB by an address comparison circuit 12AC. This address comparison circuit 12AC feeds an X decoder 12XD with a detect signal 12φ at the logic value "1" when the comparison result is coincident. When the detect signal 12φ is at the logic value (logic level) "1", the X decoder 12XD inhibits the word line selecting operation by the row address from the address buffer 12AB and selects the redundancy word line WLdR. As a result, the memory access relating to the defective word line is replaced by the selecting operation of the redundancy memory cell relating to the redundancy word line WLdR. The remaining constructions of the DRAM 12 will be described hereinafter.

The SRAM 13 is utilized as a quick access memory such as a register file or a data buffer memory. A memory cell array 13MA of the SRAM 13 has not only normal word lines WLs_0 to WLs_Ns but also a redundancy word line WLsR. The select terminals of normal static memory cells are coupled to the normal word lines WLs_0 to WLs_Nd, and the select terminal of redundancy static memory cells is coupled to the redundancy word line WLSR. Which are of the normal word lines WLs_0 to WLs_Ns is to be replaced by the selection of the redundancy word line WLsR is determined by the repair information which is set in a repair address register 13AR. The repair row address information contained in the repair information is compared with the row address signal from an address buffer 13AB by an address comparison circuit 13AC. This address comparison circuit 13AC feeds an X decoder 13XD with a detect signal 13φ at the logic value "1" when the comparison result is coincident. When the detect signal 13φ is at the logic value "1", the X decoder 13XD inhibits the word line selecting operation by the row address from the address buffer 13AB, and selects the redundancy word line WLsR. As a result, the memory access relating to the defective word line is replaced by the selecting operation of the redundancy memory cell relating to the redundancy word line WLsR. The remaining constructions of the SRAM 13 will be described hereinafter.

The flash memory 11 is provided with a memory cell array 11MA in which electrically erasable and programmable nonvolatile memory cells having control gates and floating gates are arranged in the form of a matrix. The memory cell array 11 MA is used as regions for storing the operation programs of the CPU 10 and the repair information of the DRAM 12 and the SRAM 13. The memory cell array 11MA is provided with word lines WLf_0 to WLf_Nf coupled to the control gates of the nonvolatile memory cells and bit lines BLf_0 to BLf_Mf coupled to the drains of the nonvolatile memory cells. It should be understood that the constructions of these word lines WLf_0 to WLf_Nf and bit lines BLf_0 to BLf_Mf are provided in N sets in the direction normal to the sheet of FIG. 1. In this example, the nonvolatile memory cells for N bits, as arranged at the intersecting positions of the word line WLf_0 and the bit line BLf_0, provide the repair information storing regions. The timing controls of the operations to erase, program, verify and read the flash memory 11 are made by a sequence controller 11SQ. The instructions of these operations are given by commands from the CPU 10, although the invention is not especially limited thereto. The flash memory 11 can be erased in the unit of a word line, although the invention is not especially limited thereto.

The CPU 10 processes a series of data described in the programs, by executing the arithmetic operations to fetch and decode the instructions stored in the flash memory 11 and so on, to acquire operands necessary for executing the instructions from the DRAM 12, the SRAM 13 and so on in accordance with the decoding results, to operate the acquired operands, and to store the operated results again in the DRAM 12 and the SRAM 13. Whenever a rest signal RESET takes a high level, the CPU 10 interrupts all the operations even with an operation being executed, and initializes a desired node of the internal circuit to a predetermined logic value state. In this reset period (while the reset signal RESET is at the high level), the initialization is performed not only on the inside of the CPU 10 but also on the internal register of the not-shown peripheral circuit. This initialization is further performed on the repair address registers 12AR and 13AR to be described hereinafter. The reset signal RESET is changed to the high level in response to an instruction of either the power-on reset or the system reset by the operating power ON. When the reset signal RESET is negated to a low level, the CPU 10 starts the reset exceptional operation. The initialization of the CPU 10 for the reset period is performed on the program counter, the stack pointer, a control register, such as the status register, and so on. In the case of the power ON reset, on the other hand, from the instant when the power is turned ON to the instant when the reset is released, the operations of a clock generation circuit are stabilized so that a stable clock signal can be fed to the CPU 10 after the release of reset. Here, a clock pulse generator is omitted from FIG. 1. As a matter of fact, however, the clock pulse generator is provided with an oscillator and a frequency divider so that an operation reference clock signal is fed to various infernal circuits, including the CPU 10.

In response to the reset period of the reset signal RESET, the flash memory 11 performs an operation to read the repair information. Specifically, the sequence controller 11SQ, when it detects the reset period, activates a sense amplifier 11SA and an output buffer 110B for enabling the reading operations. In response to the reset period instructed by the reset signal RESET, on the other hand, an X decoder 11XD and a Y decoder 11YD select the word line WLf_0 and the bit line BLf_0. As a result, the repair information stored in the memory cell of N bits is outputted to the data bus 16 of N bits.

The repair address registers 12AR and 13AR have static latches of N/2 bits for storing the repair information. Although the invention is not especially limited thereto, the data input terminals of the static latch which constitutes the repair address register 12AR are connected, while the reset signal RESET is at the high level (logic value) "1", with the less significant N/2 bits of the data bus 16 of N bits, so that the data inputted for that period can be latched by the inversion of the reset signal RESET to the low level. The data input terminals of the static latch constituting the other repair address register 13AR are connected, while the reset signal RESET is at the high level (or the logic value "1"), with the more significant N/2 bits of the data bus 16 of N bits, so that the data inputted for that period can be latched by the inversion of the reset signal RESET to the low level. When the reset period is ended, therefore, the repair information on the less significant side, as read from the flash memory 10 to the data bus 16, is latched by the repair address register 12AR of the DRAM 12, whereas the repair information on the more significant side is latched by the repair address register 13AR of the SRAM 13. From now on, in the DRAM 12 and the SRAM 13, the access at a row address is repaired, if specified by the repair information, using the redundancy word lines.

Figure 2:
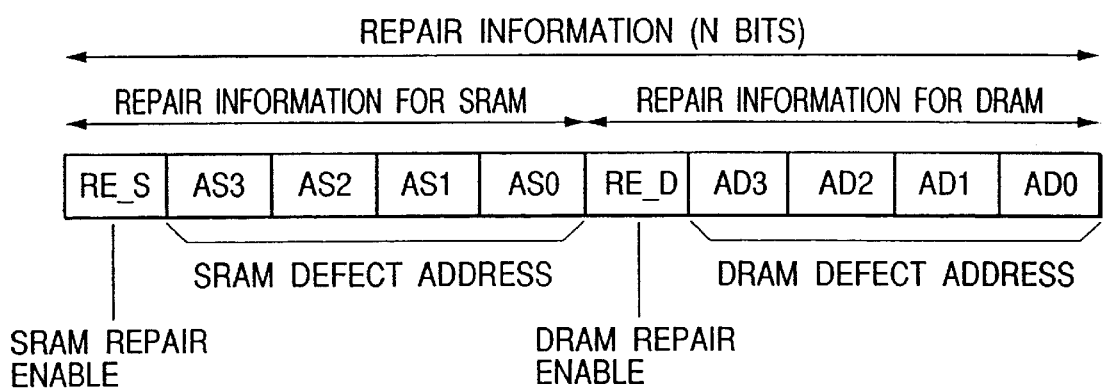
FIG. 2 is a diagram showing one detailed example of the repair information to be used by the single chip microcomputer of FIG. 1.

FIG. 2 shows one detailed example of the repair information. In this example, as described above, the repair information is a total of N bits at a maximum. In the repair information of the SRAM 13, reference characters AS3 to AS0 designate row address information to be repaired, and characters RE_S designate an SRAM repair enable bit indicating the validity of the row address information to be repaired. This bit RE_S indicates the validity of the row address information AS3 to AS0 in terms of the logic value "1". The SRAM repair enable bit RE_S programmed in the repair address register 13AR activates, the address comparison circuit 13AC, when at the logic value "1", and keeps the address comparison circuit 13AC inactive, when at the logic value "0", to fix the detect signal 13φ at the inconsistent level "0". Likewise, in the repair information of the DRAM 12, reference characters AD3 to AD0 designate row address information to be repaired, and characters RE_D designate a DRAM repair enable bit indicating the validity of the row address information to be repaired. This bit RE_D indicates the validity of the row address information AD3 to AD0 in terms of the logic value "1". The DRAM repair enable bit RE_D loaded in the repair address register 12AR activates the address comparison circuit 12AC, when at the logic value "1", and keeps the address comparison circuit 12AC inactive, when at the logic value "0", to fix the detect signal 12φ at the inconsistent level "0".

Figure 3:
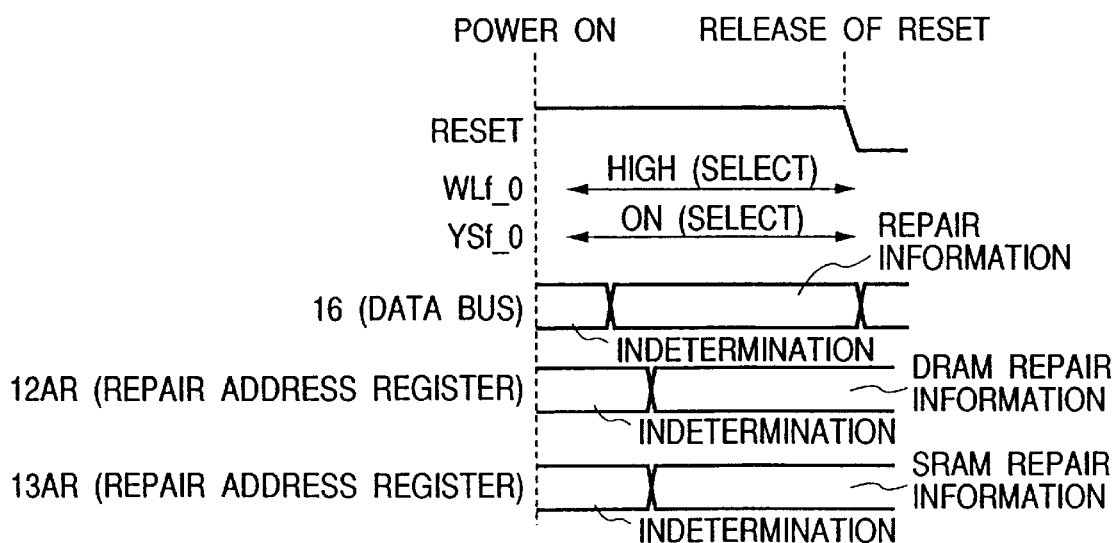
FIG. 3 is a timing chart showing one example of an initial programming operation of the repair information for a reset period.

FIG. 3 shows timings of the initial programming operations of the repair information for the reset period. This reset period is one for which the reset signal RESET is kept at the high level by the power ON reset at the time of power ON or system reset. When the ON power becomes stable, the word line WLf_0 and a Y selector YSf_0 are selected so that the repair information of the DRAM 12 and the SRAM 13 are read out in parallel to the data bus 16. The read repair information of the DRAM 12 is loaded in the repair address register 12AR, and the repair information of the SRAM 13 is loaded in the repair address register 13AR, so that the load data are latched by the release of reset.

In FIG. 1, the sequence controller 11SQ of the flash memory 11 has a mode register 11MR, and the operation of the flash memory 11 is determined according to the set content of the mode register 11MR.

Like the well-known flash memory, the mode register 11MR has program enable bits for instructing the programming operations, erase enable bits for instructing the erase operations, and so on. When the programming operation and the erase operation are instructed with the program enable bits and the erase enable bits, although not shown, the accessible range in the memory cell array 11MA is determined according to the set state of a mode bit MB2. On the other hand, the access subject at this time is determined with the value of a mode bit MB1. Specifically, the mode register 11MR can be accessed through the data bus 16, and there can be reflected directly on its specific mode bit MB1 the value of an external terminal P1 of the single chip microcomputer (as will be called merely the "microcomputer", too) 1A. The mode bit MB1 is for designating an operation mode (or EPROM writer mode) for allowing the flash memory 11 to be programmed by a write device such as an EPROM writer connected with the outside of the microcomputer. When the mode bit MB1 is given the logic value "1", the function of the external input/output circuit 14 is so changed that the microcomputer 1A may have an external interface function apparently equivalent to the semiconductor integrated circuit device (or bus slave) of the single flash memory, and the operations of the CPU 10 are interrupted. In response to the logic value "1", of the mode bit MB1, more specifically, the buffer circuit connected with the address bus 15, the data bus 16 and the control bus 17 of the CPU 10 is set to the high impedance state so that the CPU 10 is electrically isolated from the individual buses 15, 16 and 17. In this EPROM writer mode, the external input/output circuit 14 inputs and feeds the address signal from the outside to the address bus 15, outputs the data (of the data bus 16 in response to the instruction of the read operation by the read signal from the outside, and inputs and feeds the data to the data bus 16 in response to a write operation instruction by the write signal from the outside. When the mode bit MB1 is at the logic value "0", on the other hand, the flash memory 11 becomes accessible by the control of the CPU 10. In short, the buffer circuit coupled to the individual buses 15, 16 and 17 of the CPU 10 connects the CPU 10 electrically with the individual buses 15, 16 and 17 in response to the logic value "0" of the mode bit MB1.

The mode bit MB2 of the mode register 11MR is a control bit for determining whether or not the reprogramming of the nonvolatile memory for storing the selective repair information is allowed by the word line WLf_0 and the Y selector YSf_0 and enables the reprogramming of the repair information in terms of the logic value "0", but disables the reprogramming of the repair information in terms of the logic value "1". When the mode bit MB2 is at the logic value "1", the sequence controller 11SQ sets the level of the word line WLf_0 to the voltage such as 0 V for disabling both erase and programming irrespective of the row address signal in the erase and programming operations. As a result, the erase operation at the unit of a word line and the programming operation at the unit of N bits are disabled together when the memory cell is connected with the word line WLf_0. When the mode bit MB2 is at the logic value "0", the memory cell of the word line WLf_0 can be freely erased and programmed.

Figure 4A:
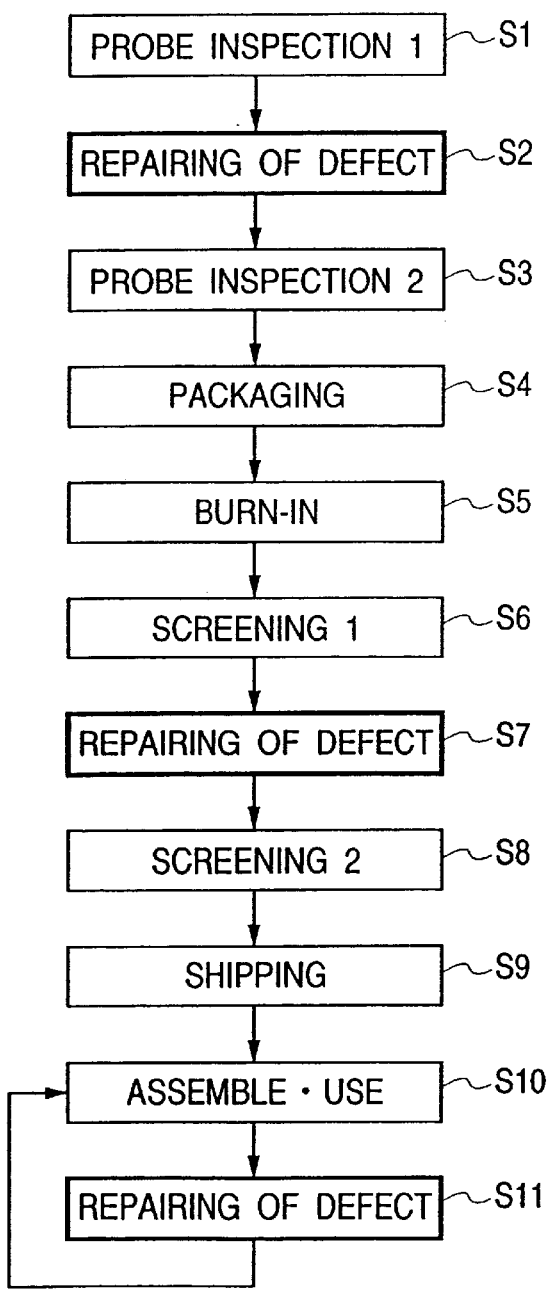
FIGS. 4(A) and 4(B) are flow charts showing a defect repairable timing for the single chip microcomputer in time series from a manufacturing step.
Figure 4B:
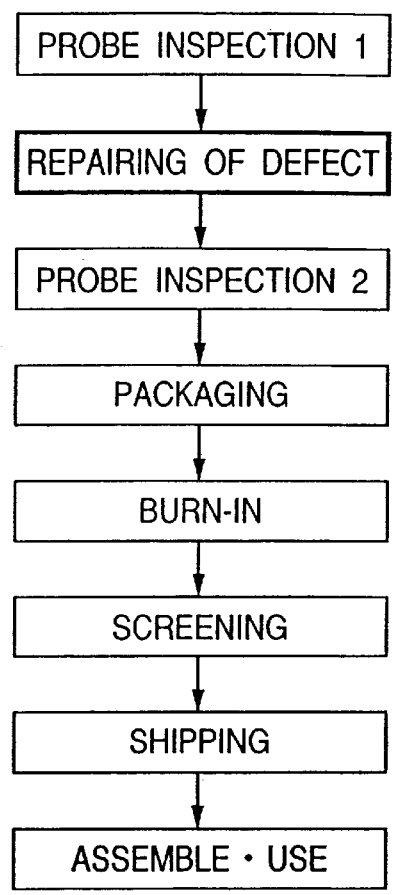

In the microcomputer 1A, which is enabled to set the operation mode, the defect repairs of the DRAM 12 and the SRAM 13 can be performed (at S2), as exemplified in FIG. 4(A), first of all, on the result of a first probe inspection (S1) of a chip which was manufactured in the wafer process by the maker of the microcomputer 1A. In the repair at this time, the microcomputer 1A is brought into the EPROM writer mode by the mode bit MB1 so that the flash memory 11 can be accessed by using a dedicated write device, such as a tester or an EPROM writer, and the mode bit MB2 is set to the logic value "0" to write the repair information in a predetermined region of the flash memory 11. After this, the probe inspection is performed again (at S3), and a screening (S6) is performed by way of a packaging (S4) and a burn-in test (S5) for testing the reliability by making the power voltage Vdd higher than that of the ordinary operation. A chance for repairing a defect can be given (at S7) to the article which was newly found to be defective the burn-in test. When a defect is actualized by the burn-in test in the microcomputer 1A, which was not found defective at Step S2, for example, it can be repaired (at S7) like before. The defect-repaired article is screened (at S8) again and is then shipped (at S9). The user having purchased that article assembles the microcomputer with a desired circuit substrate, so that the assembled circuit is suitably operated (at S10). In this operation, the mode bit MB2 is set to the logic value "1" so that the repair information may not be erroneously reprogrammed. The microcomputer 1A thus operated in the on-board state is caused, if necessary, to execute a defect diagnosing test program (or diagnostic program) to decide whether or not a defect exists and whether the defect can be repaired (at S11), if discovered, in the on-board state through the CPU 10 which is packaged in the microcomputer 1A. For example, either a defect, which has developed as a microcomputer 1A having no defect in the manufacturing process is aged to deteriorate its circuit elements or circuit factors, or a new defect, which is developed according to changes in the operating environments such as the operating temperature or the operating voltage, can be repaired. As compared with the defect repairing technique using a fuse, as shown in FIG. 4(B), the time period for the repairs is elongated three or more times.

The diagnostic program for repairing of defects due to the on-board write operation and the write program to be executed at the on-board programming time can be stored in regions other than the word line WLf_0 of the flash memory 11. The diagnostic programs could be automatically executed either by instructing the CPU 10 arbitrarily by an interruption or by using a timer. Although the content of the diagnostic program is not shown in detail, it performs the operations to write a predetermined test pattern in the SRAM 13 and the DRAM 12 and read it, to determine the existence of a defect by comparing the read data and expected value data, and to inspect, if a defect is detected, whether or not a repairable redundancy construction is left. When the repairable redundancy construction is left, the CPU 10 is caused to execute the write program thereby to write the repair information in a predetermined memory cell of the flash memory 11 so that the repair information for repairing the defect may be programmed in the repair information storing nonvolatile memory cell of the flash memory 11. When the repairable redundancy construction is not left, the CPU 10 can set the error status bit to perform an interruption (e.g., an indication of a service man call).

Figure 5:
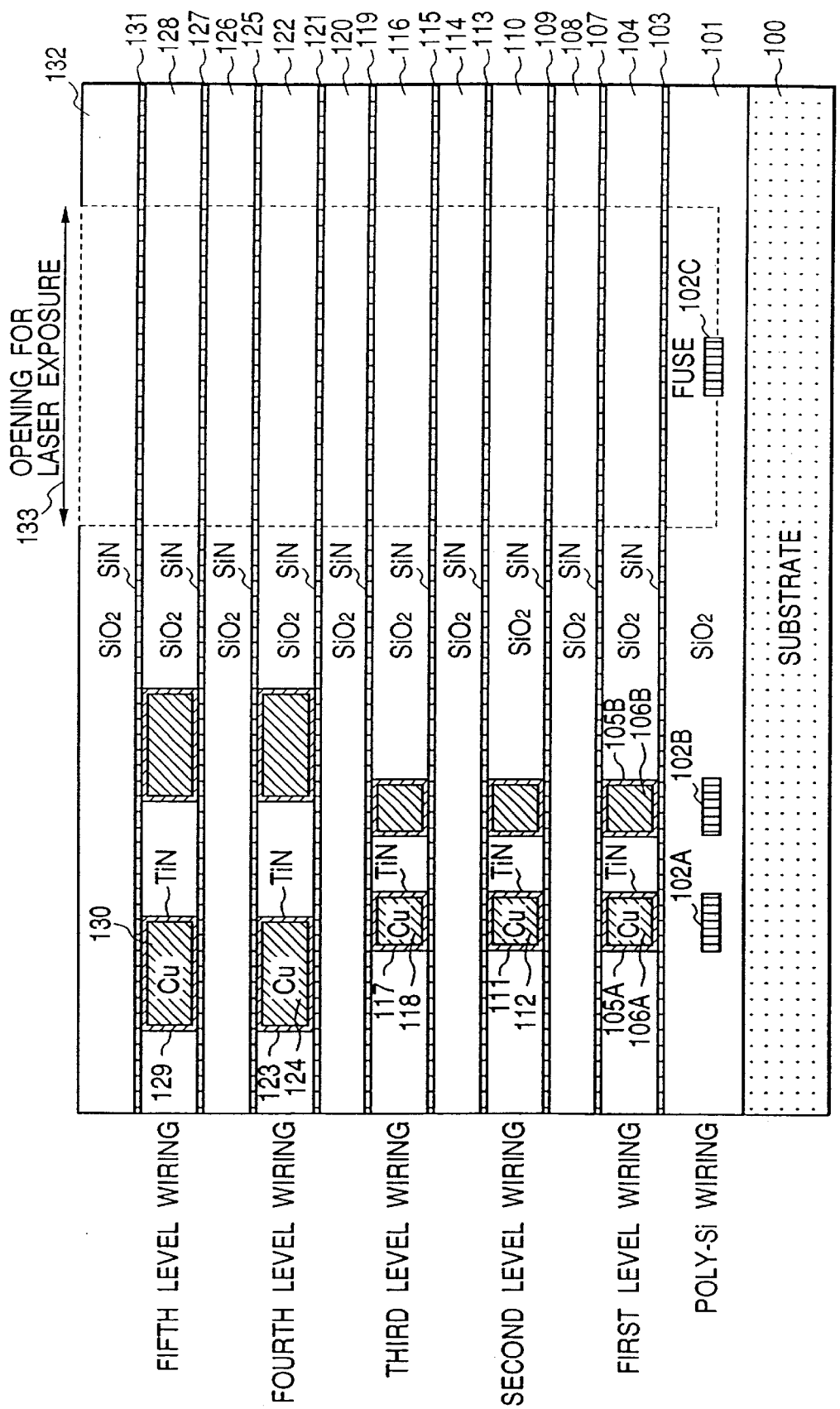
FIG. 5 is a device cross section schematically showing the behavior of a laser-fusing opening of a fuse for a copper wiring process.

The single chip microcomputer 1A thus far described as the system LSI can eliminate the fuse program circuit for repairing a defect and a fusing apparatus or step so that it can lower the testing cost. In view of the background that the process for forming the laser fusing opening is complicated, as in the copper wiring process, the process of manufacture is simplified because no fuse program circuit is used. Let it be assumed, as exemplified in FIG. 5, that the copper wiring layer to be formed individually through titanium nitride (TiN) layers 105, 111, 117 and so on over the lowermost poly-Si wiring layer 102 over a silicon substrate (or Si substrate) 100 made of single crystalline silicon for forming the not-shown circuit elements such as MOSFETs thereover are a first layer 106 to fifth wiring layers (112, 118, 124 and 130). When an opening 133 for exposing the laser-fusible poly-Si fuse through a final passivation film 132 is to be formed, the etching gas for etching layer insulating films (of silicon oxide) 128, 126, 122 and so on and the etching gas for many SiN layers have to be alternately interchanged many times causing a significant increase in the number of manufacturing steps, because it is difficult to remove at a single etching step the silicon nitride (SiN) layers 131, 127, 125, 121, 119, 115, 113, 109, 107 and 103 acting as etching stoppers for forming channels to bury the wiring lines so as to flatten the wiring layers. Unless the fuse program circuit is used for repairing the defect, no problem arises in the process using the copper wiring. In short, the semiconductor integrated circuit device 1A of the invention and semiconductor integrated circuits 1B and 1C to be described hereinafter are given the device structure in which the fuse 102C is omitted from the device section of FIG. 5. As a result, it is possible to provide the semiconductor integrated circuits 1A, 1B and 1C which have low wiring resistances and which can operate at high frequencies.

Since the repair information for the flash memory 11 can be reprogrammed, on the other hand, a defect which has occurred after the burn-in can be newly repaired, and the defect which occurs due to aging after the assembly in the system or the circuit substrate can also be repaired.

Thus it is possible to improve the efficiency of repairing defect in a circuit, such as a single chip microcomputer 1A having a large-scale logic construction, on which not only the CPU 10 but also the volatile memory such as the DRAM 12 and the SRAM 13 is mounted together with the flash memory 11. As a result, the yield of the semiconductor integrated circuit device 1A having a large-scale logic can be improved to realize a cost reduction.

Here will be supplementarily described the constructions, the descriptions of which have been omitted, of the DRAM 12, SRAM 13 and flash memory 11.

<<DRAM>>

Figure 6:
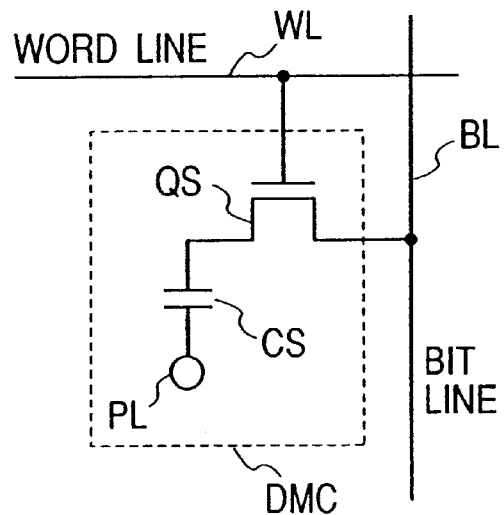
FIG. 6 is a circuit diagram showing one example of a dynamic memory cell.
Figure 7:
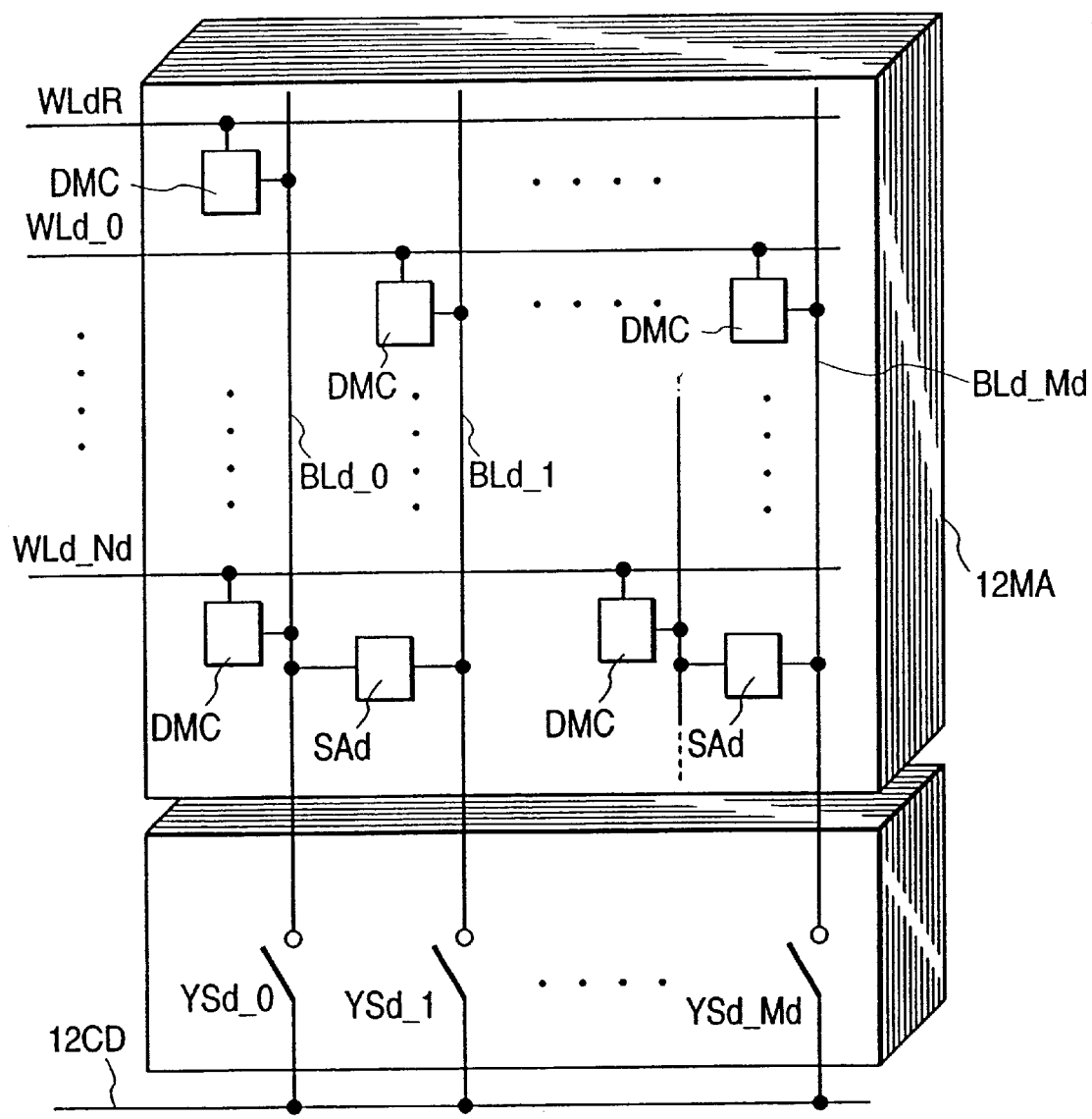
FIG. 7 is a schematic diagram showing one example of a memory cell array of a DRAM.

In the DRAM 12, the memory cell array 12MA is provided with a number of well-known dynamic memory cells DMC including an address selecting MOSFET QS and an information latching capacitor CS, as exemplified in FIG. 6, of which the gate of the MOSFET QS as a selecting terminal is connected with a corresponding word line WL and the drain or source of the MOSFET QS as the data input/output terminal is connected with a corresponding bit line BL. The capacitor CS has one electrode used as a common electrode PL, which is supplied with a predetermined power source equal to one half of the power voltage. The memory cell array 12MA has a well-known folded bit line structure with respect to a sense amplifier SAd of a static latch shape, as exemplified in FIG. 7, and is provided with bit lines BLd_0 to BLd_Md. In a direction to intersect the bit lines BLd_0 to BLd_Md, there are arranged word lines WLd_0 to WLd_Nd and the redundancy word line WLdR for repairing a defect. A redundancy bit line also could be provided, although not especially shown. The bit lines BLd_0 to BLd_Md are commonly connected with a common data line 12CD through Y selectors YSd_0 to YSd_Md. One of the word lines WLd_0 to WLd_Nd and the redundancy word line WLdR are selected by the X decoder 12XD as shown in FIG. 1. One of the Y selectors YSd_0 to YSd_Md is turned ON by the decode output of a Y decoder 12YD. It should be understood that the memory cell array 12MA and the Y selectors YSD_0 to YSd_md are provided in N sets in the direction normal to the sheet of FIG. 1. As a result, the data are inputted and outputted in the unit of N bits to and from the common data line 12CD when the select operation is performed by the X decoder 12XD and the Y decoder 12YD. The program data are fed from the data bus 16 to an input buffer 121B so that a write buffer 12WB drives the bit lines through the common data line 12CD in accordance with the input data. In the data reading operations,, the read data transmitted from the bit lines to the common data line 12CD are amplified by the main amplifier 12MA, and the amplified data are outputted from an output buffer 120B to the data bus 16.

The repair information for specifying the row address of the normal word line to be repaired by the redundancy word line WLdR is set in the repair address register 12AR. This repair address register 12AR includes a static latch of a plurality of bits, and its data input terminal is conducted to the data bus 16 in response to the high level of the reset signal RESET so that the repair information is programmed from the data bus 16. The repair information thus programmed is compared, when valid, with the row address signal from the address buffer 12AB by the address comparison-circuit 12AC. The detect signal 12φ is set to the logic value "1", when the comparison result is coincident, but otherwise it is set to the logic value "0". The X decoder 12XD and the Y decoder 12YD are fed with the address signal of the address bus 15 through the address buffer 12AB and the decode the address signal fed thereto. Especially, the X decoder 12XD decodes the row address signal from the address buffer 12AB, when the detect signal 12φ fed from the address comparison circuit 12AC is at the logic value "0" indicating a non-coincidence, but is inhibited from decoding the row address signal from the address buffer 12AB and selects the redundancy word line WLdR, when the detect signal 12ϕ is at the logic value "1", indicating a coincidence. As a result, the memory access relating to the defective word line is replaced by the select operation of the redundancy memory cell relating to the redundancy word line WLdR.

The internal timing control of the DRAM 12 is effected by a timing controller 12TC. This timing controller 12TC is fed with a strobe signal such as the read signal or the write signal from the CPU 10 through the control bus 17 and further with the address signal of a plurality of bits, deemed as the memory select signal, from the address bus 15. When the operation select of the DRAM 12 is detected by the timing controller 12TC, the circuit such as the X decoder 12XD is activated. When the read operation is instructed by the read signal, the stored information of the memory cell selected in the memory cell array 12MA is outputted to the data bus 16 through the main amplifier 12MA and the output buffer 120B. When the write operation is instructed by the write signal, the data, as inputted through the input buffer 12ID and the write buffer 12WB, are written in the memory cell selected in the memory cell array 12MA.

<<SRAM>>

Figure 8:
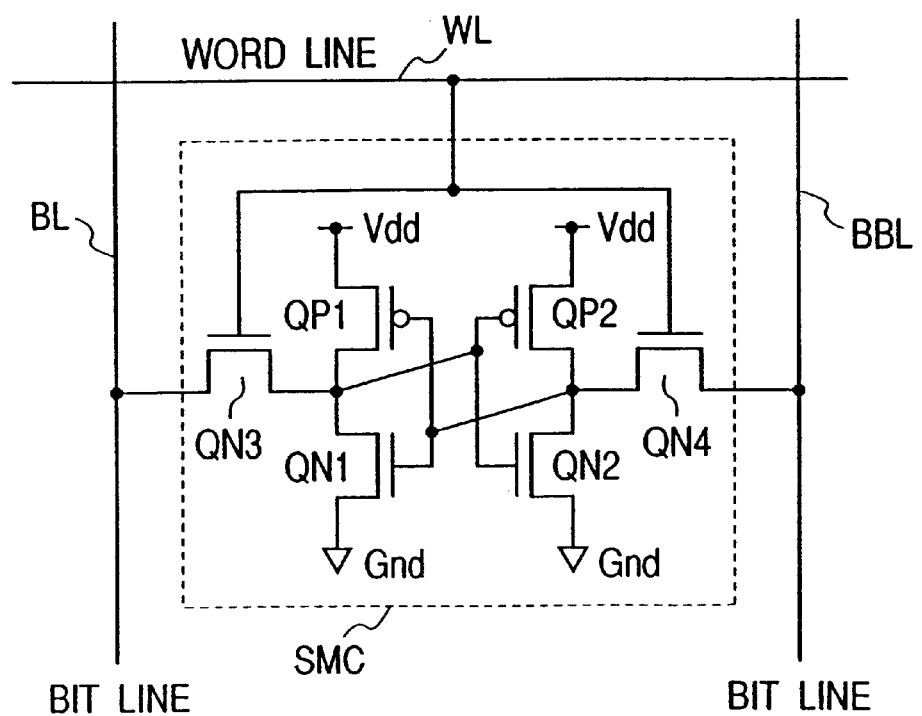
FIG. 8 is a circuit diagram showing one example of a CMOS static memory cell.
Figure 9:
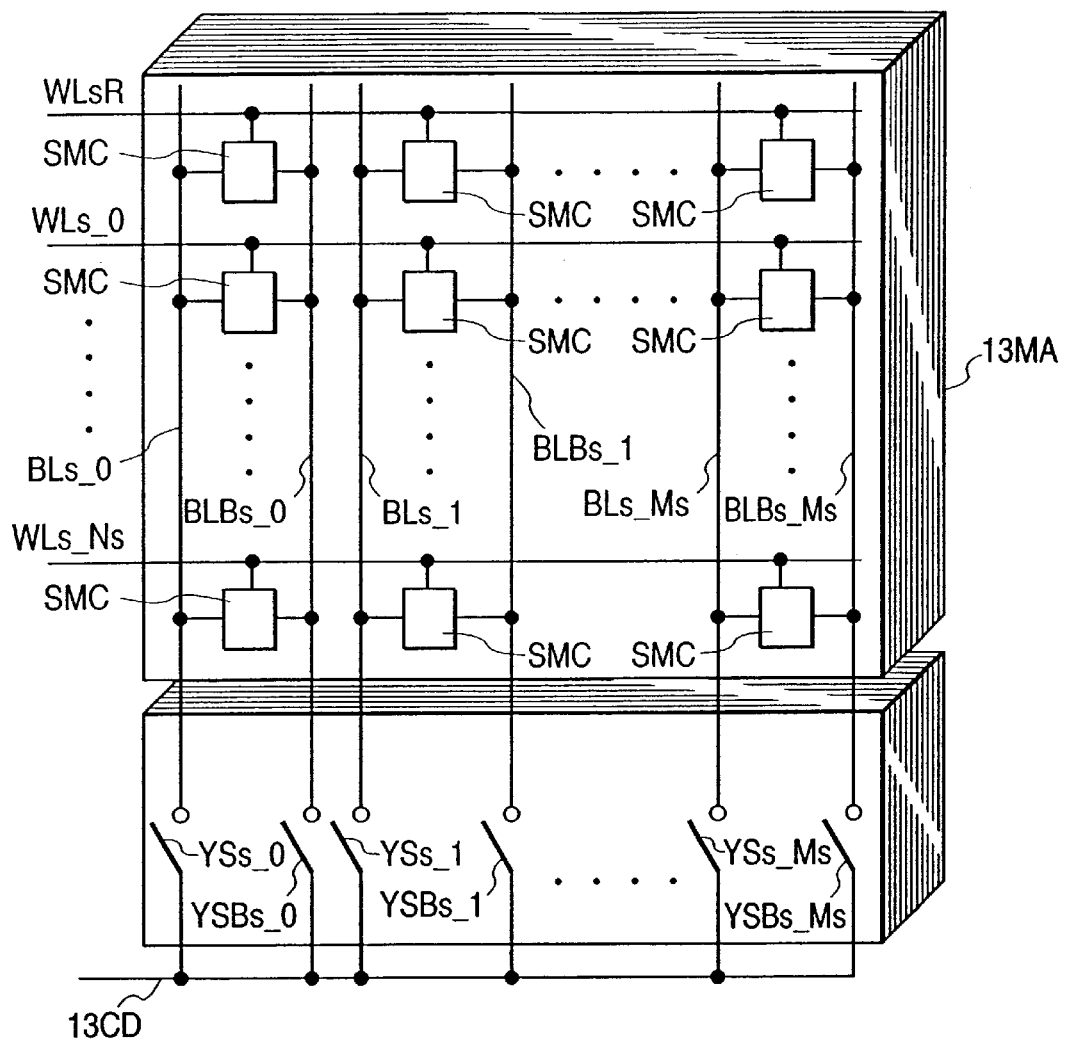
FIG. 9 is a schematic diagram showing one example of a memory cell array of a SRAM.

The SRAM 13 is provided in the memory cell array 13MA with a number of well-known CMOS static memory cells SMC, as exemplified in FIG. 8. Specifically, the CMOS static memory cell SMC includes P-channel MOSFETs QP1 and QP2 and N-channel MOSFETs QN1 to QN4, as shown in FIG. 8. The MOSFETs QP1 and QN1 and the MOSFETs QP2 and QN2 are individually deemed to form CMOS inverters, and their input terminals and output terminals are cross-connected to construct one CMOS latch circuit as a whole. The MOSFETs QN3 and QN4 from a select switch. The gates of the MOSFETs QN3 and QN4 from the select terminal of the memory cell and are connected with the corresponding word line WL. The drains or sources of the MOSFETs QN3 and QN4, as connected with corresponding paired bit lines BL and BBL, are used as the data input/output terminals of the memory cell. The memory cell may be constructed into a resisting program type static latch shape. The memory cell array 13MA is provided, as exemplified in FIG. 9, with complementary bit lines BLs_0, BLBs_0 to BLs_Ms, and BLBs_Ms. In a direction to intersect these complementary bit lines BLs_0, BLBs_0 to BLs_Ms, and BLBs_Ms, there are arranged the word lines WLs_0 to WLs_Ns, and there is provided the redundancy word line WLSR for repairing a defect. The redundancy bit line could also be adopted although not especially shown. The complementary bit lines BLs_0, BLBs_0 to BLs_Ms, and BLBs_Ms are commonly connected with a common data line 13CD through Y selectors YSs_0, YSBs_0 to YSs_Ms, and YSBs_Ms. As shown in FIG. 1, one of the word lines WLs_0 to WLs_Ns and the redundancy word line WLSR is selected by the X decoder 13XD. One pair of the Y selectors YSs_0, YSBs_0 to YSs_Ms, and YSBs_Ms is turned ON with the decode output of the Y decoder 13YD. It should be understood that the memory cell array 13MA and the Y selectors YSs_0, YSBS_0 to YSs_Ms and YSBs_Ms are provided in N sets in a direction normal to the sheet of FIG. 1. As a result, the data are inputted and outputted in the unit of N bits to and from the common data line 13CD when the select operation is performed by the X decoder 13XD and the Y decoder 13YD. The program data are fed from the data bus 16 to an input buffer 13IB so that a write buffer 13WB drives the bit lines through the common data line 13CD in accordance with the input data. In the data reading operations, the read data transmitted from the bit lines to the common data line 13CD are amplified by the sense amplifier 13SA, and the amplified data are outputted from an output buffer 13OB to the data bus 16.

The repair information for specifying the row address of the normal word line to be repaired by the redundancy word line WLsR is set in the repair address register 13AR. This repair address register 13AR includes a static latch of a plurality of bits, and its data input terminal is conducted to the data bus 16 in response to the high level of the reset signal RESET so that the repair information is programmed from the data bus 16. The repair information thus programmed is compared, when valid, with the row address signal from the address buffer 13AB by the address comparison circuit 13AC. The detect signal 13 is set to the logic value "1", when the comparison result is coincident, but otherwise it is set to the logic value "0". The X decoder 13XD and the Y decoder 13YD are fed with the address signal of the address bus 15 through the address buffer 13AB and they decode the address signal fed thereto. Especially, the X decoder 13XD decodes the row address signal from the address buffer 13AB, when the detect signal 13ϕ fed from the address comparison circuit 13AC is at the logic value "0" indicating a non-coincidence, but is inhibited from decoding the row address signal from the address buffer 13AB and selects the redundancy word line WLSR, when the detect signal 13ϕ is at the logic value "1" indicating a coincidence. As a result, the memory access relating to a defective word line is replaced by the select operation of the redundancy memory cell relating to the redundancy word line WLsR.

The internal timing control of the SRAM 13 is effected by a timing controller 13TC. This timing controller 13TC is fed with a strobe signal such as the read signal or the write signal from the CPU 10 through the control bus 17 and further with the address signal of a plurality of bits, deemed as the memory select signal, from the address bus 15. When the operation select of the SRAM 13 is detected by the timing controller 13TC, a circuit such as the X decoder 13XD is activated. When the read operation is instructed by the read signal, the stored information of the memory cell selected in the memory cell array 13MA is outputted to the data bus 16 through the sense amplifier 13SA and the output buffer 13OB. When the write operation is instructed by the write signal, the data, as inputted through the input buffer 13IB and the write buffer 13WB, are programmed in the memory cell selected in the memory cell array 13MA.

<<Flash Memory>>

Figure 10:
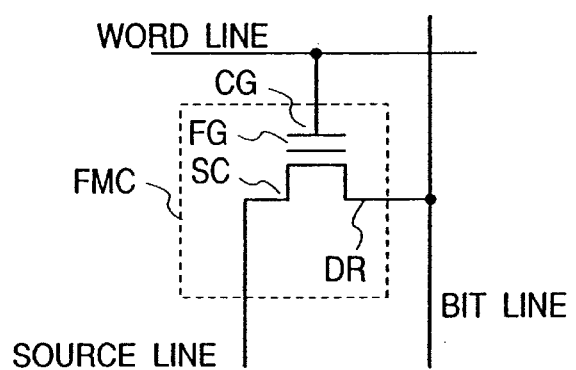
FIG. 10 is a circuit diagram showing one example of a flash memory cell.
Figure 11:
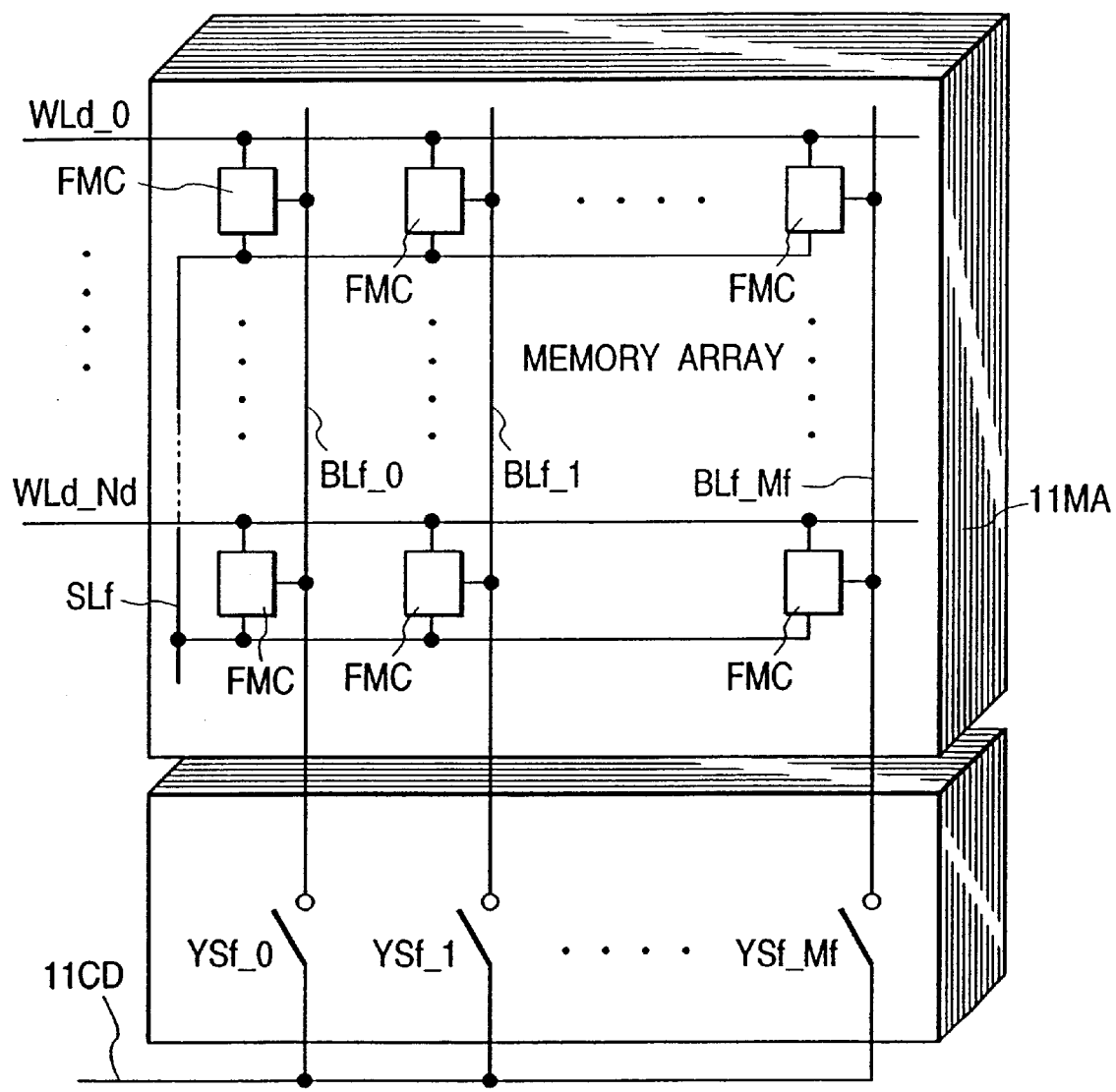
FIG. 11 is a schematic diagram showing one example of a memory cell array of a flash memory.

The flash memory 11 is provided at its memory cell array 11MA with a number of nonvolatile memory cells (or flash memory cells) FMC, as exemplified in FIG. 10. The memory cell FMC is constructed to include one memory cell transistor having a control gate (CG), a floating gate (FG), a source (SC) and a drain (DR). The memory cell array 11MA is provided, as exemplified in FIG. 11, with bit lines BLf_0 to BLf_Mf, to which the drains of the flash memory cells FMC are coupled, word lines WLf_0 to WLf_Nf, to which the control gates of the flash memory cells FMC are coupled, and a source line SLf, to which the sources of the flash memory cells FMC are coupled. In this example, the source line SLf is shared among the individual memory cells FMC. The bit lines BLf_0 to BLf_Mf are commonly connected with a common data line 11CD through the Y selectors YSf_0 to YSf_Mf. As shown in FIG. 1, the select operations of the word lines WLf_0 to WLf_Nf are performed by, the X decoder 11XD. The voltages to be fed to the selected word lines and the non-selected word lines are controlled by the sequence controller 11SQ in response to the individual erasing, programming and reading operations. One of the Y selectors YSf_0 to YSf_Mf is turned ON with the decoded output of the Y decoder 11YD. It should be understood that the memory cell array 11MA and the Y selectors YSf_0, YSf_Mf are provided in N sets in a direction normal to the sheet of FIG. 1. When the selecting operations are performed by the X decoder 11XD and the Y decoder 11YD, therefore, the data can be inputted and outputted in the unit of N bits between the memory cells and the common data line 11CD. The write data are fed from the data bus 16 to an input buffer 11IB so that a write buffer 11WB drives the bit lines through the common data line 11CD in accordance with the input data. In the data reading operations, the read data, as transmitted from the bit lines to the common data line 11CD, are amplified by the sense amplifier 11SA so that the amplified data are outputted from the output buffer 11OB to the data bus 16. In this example, the erase operations are performed in the unit of a word line. Here. the source lines, as omitted from FIG. 1, are fed from the sequence controller 11SQ with the source line voltages according to the modes of the individual erasing, programming and reading operations.

Figure 12:
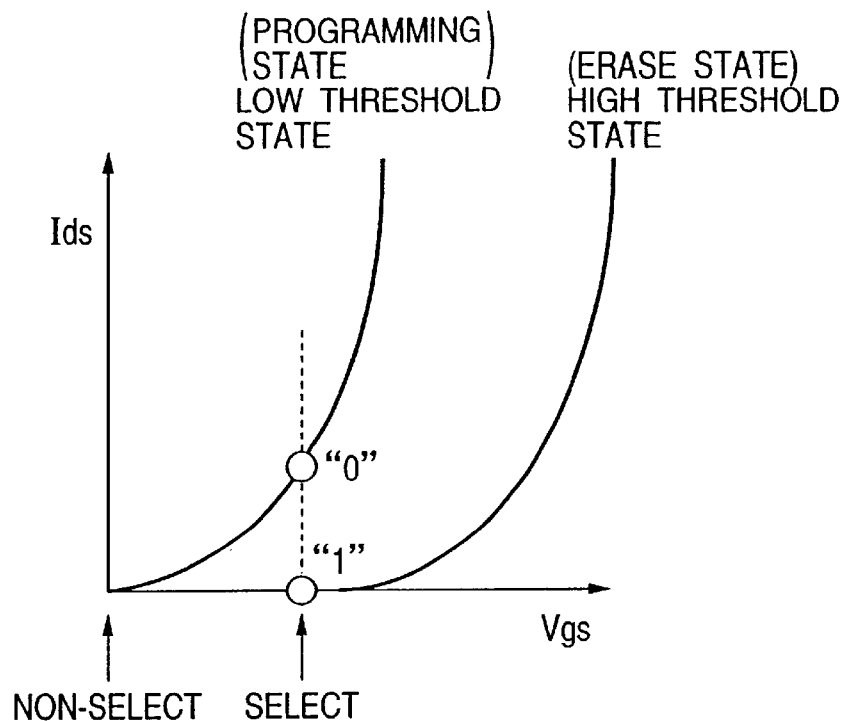
FIG. 12 is a characteristic diagram showing one example of a programming state and an erase state in the flash memory.

The sequence control and the voltage control of the flash memory 11 are performed by the sequence controller 11SQ. Here will be described a voltage control mode by the sequence controller 11SQ. First of all, the memory cell FMC (or N channel MOS type memory cell transistor) can hold the information in dependence upon whether the electric charge is much or little in the floating gate. When the charge is injected into the floating gate, for example, the threshold voltage of the memory cell rises. The memory current is stopped by raising the threshold voltage to a voltage value to be applied to the control gate or higher. By discharging the electric charge from the floating gate, on the other hand, the threshold voltage is lowered. When the threshold voltage is made lower than the value of the voltage to be applied to the control gate, the memory current flows. As shown in FIG. 12, for example, the state at the low threshold voltage can be assigned to the "0" information holding state (e.g., the programming state) whereas the state at the high threshold voltage can be assigned to the "1" information holding state (e.g., the erase state). These assignments belong merely to definitions, and no problem arises even if the definitions are reversed. The memory operations are coarsely divided into read, program and erase operations. The program verify and the erase verify operations are substantially identical to the read operation.

Figure 13:
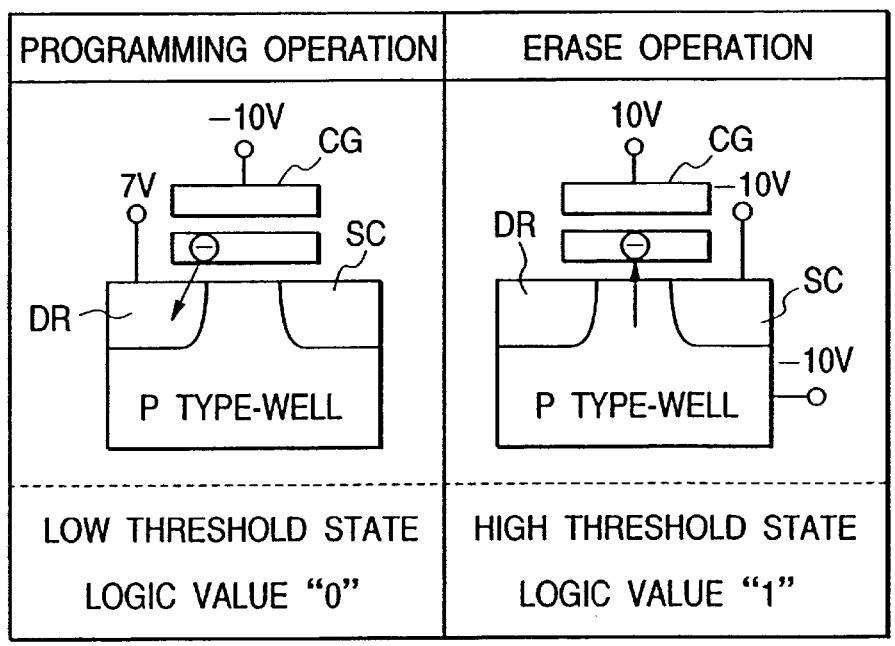
FIG. 13 is a diagram showing one example of the voltage applied states in the programming operation and the erase operation of the flash memory.

In the reading operation, the reading potential (e.g., Vcc=5 V) is applied to the control gate CG. The stored information of the selected memory cell at this time is determined on its "0" or "1", depending upon whether or not the electric current flows through that memory cell. In the erase operation, as exemplified in FIG. 13, a positive voltage (e.g., 10 V) is applied to the control gate CG, whereas a negative voltage (e.g., −10 V) is applied to the source of the memory cell. The drain DR may be floating or at the same negative voltage (e.g., −10 V) as that of the well. Therefore, the electric charges can be injected by the tunnel effect into the floating gate. As a result, the threshold voltage of the memory cell FMC is raised. The erase verify operation is substantially identical to the foregoing reading operation, but for the difference in the word line voltage for the verification. In the programming, as exemplified in FIG. 13, a negative potential (e.g., −10 V) is applied to the control gate CG, and a positive voltage (e.g., 7 V) is applied to the drain DR to cause the source SC to float. Therefore, the electric charge is released only from the memory cell having a positive voltage applied to its drain. As a result, the threshold voltage of the memory cell FMC is lowered. The subsequent write verifying operation is performed as in the foregoing reading operation.

<<Second Single Chip Microcomputer>>

Figure 14:
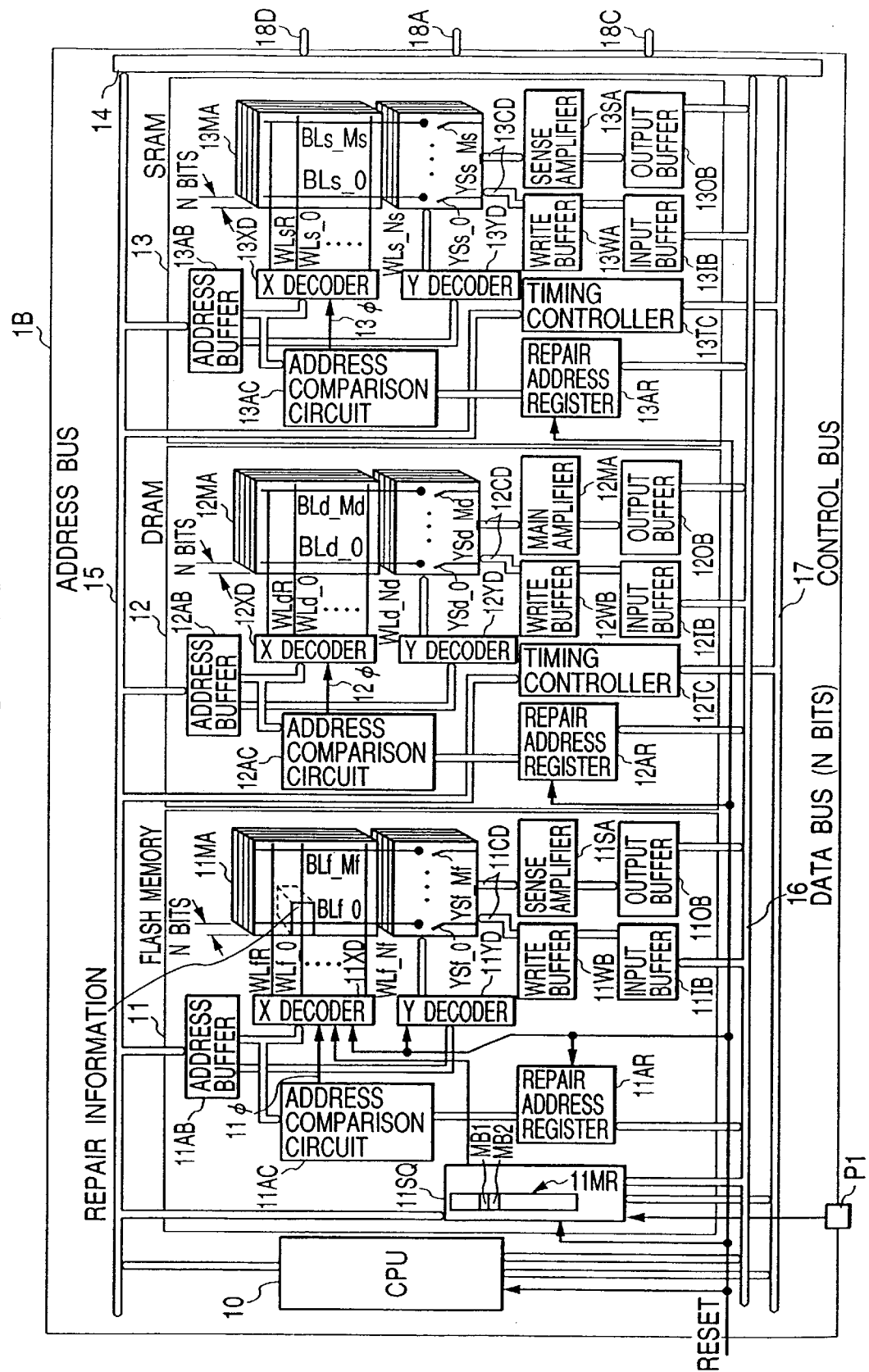
FIG. 14 is a block diagram of a second single chip microcomputer another embodiment of the semiconductor integrated circuit device according to the invention.

FIG. 14 shows a second single chip microcomputer representing another embodiment of the semiconductor integrated circuit device according to the invention. The single chip microcomputer 1B, as shown in FIG. 14, is different from that of FIG. 1 in that it has a redundancy construction for repairing a defect. Specifically, the memory cell array 11MA is provided with a redundancy word line WLfR in addition to the normal word lines WLf_0 to WLf_Nf To the redundancy word line WLfR, too, there are coupled the control gates of the memory cells FMC, of which the drains are coupled to the corresponding bit lines, whereas the sources are coupled to the source lines. Which one of the normal word lines WLf_0 to WLf_Nf is to be replaced in selecting the redundancy word line WLfR is determined by the repair information which is set in a repair address register 11AR. The repair row address information contained in the repair information is compared by an address comparison circuit 11AC with the row address signal from an address buffer 11AB. The address comparison circuit 11AC supplies the X decoder 11XD with a detect signal 11φ of the logic value "1" when the comparison result is coincident. When the detect signal 11φ is at the logic value "1", the X decoder 11XD inhibits the word line selecting operation by the row address from the address buffer 11AB, but selects the redundancy word line WLfR. As a result, the memory access relating to a defective word line is replaced by the operation to select the redundancy memory cell relating to the redundancy word line WLfR.

This construction is not different in the reading of the repair information to the data bus 16 for the reset period from the construction of FIG. 1 in which the read operation is performed by one time. In the case of FIG. 14, therefore, the repair information of totally N bits at the maximum has to be divided by one time into the three repair address registers 11AR, 12AR and 13AR. In order to satisfy this, it is assumed that the data input terminals of the three repair address registers 11AR, 12AR and 13AR are so separately coupled to the signal lines of individual bits of the data bus of N bits.

Figure 15:
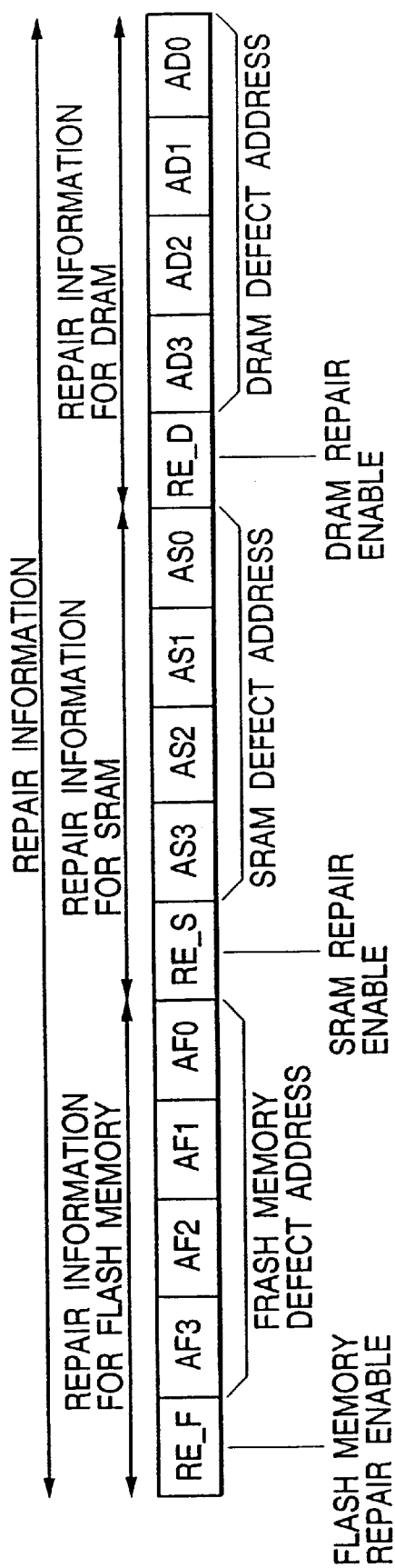
FIG. 15 is a diagram showing one example of the repair information in the second single chip microcomputer.

FIG. 15 shows one example of the repair information stored in the repair information storing region of the flash memory 11. As compared with that of FIG. 2, there are added repair row addresses AF3 to AF0 of the flash memory 11 and a repair enable bit RE_F of the flash memory. If the repair information to be read out to the data bus 16 is N bits as a whole, the signal line of the data bus 16 is coupled to the data input terminals of the corresponding repair address registers 11AR, 12AR and 13AR keeping the array of FIG. 15. The bit RE_F indicates the validity of the row address information AF3 to AF0 with the logic value "1". The repair enable bit RE_F, as loaded in the repair address register 11AR, activates the address comparison circuit 11AC, when it is at the logical value "1", and keeps the address comparison circuit 11AC inactive, when at the logic value "0", to fix the detect signal 11φ at the inconsistent level "0".

Figure 16:
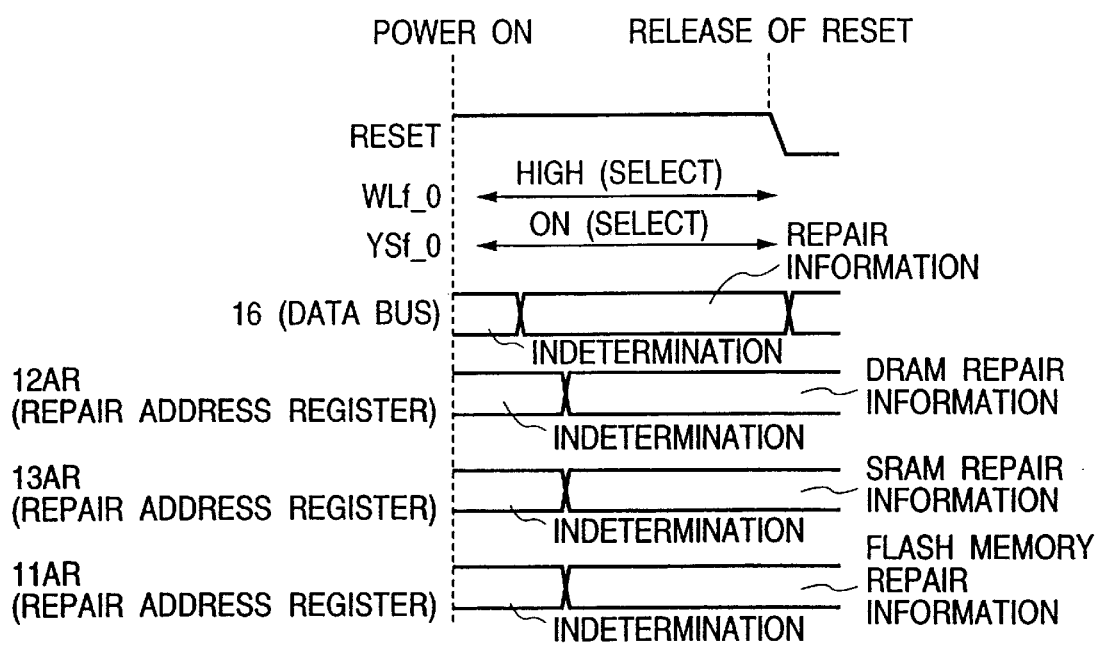
FIG. 16 is a timing chart showing one example of an initial programming operation of the repair information in the second single chip microcomputer.

FIG. 16 shows timings of the initial programming operation of the repair information for the reset period. The period for which the reset signal RESET is set at the high level by the power-on reset at the time of power ON or by the system reset is the reset period. When the ON power is stabilized, the word line WLf_0 and the Y selectors YSf_0 are selected so that the items of repair information of the flash memory 11, the DRAM 12 and the SRAM 13 are read out in parallel to the data bus 16. The read repair information of the flash memory 11 is loaded in the repair address register 11AR, the repair information of the DRAM 12 is loaded in the repair address register 12AR, and the repair information of the SRAM 13 is loaded in the repair address register 13AR, so that the load data are latched by releasing the reset.

According to this single chip microcomputer 1B, a defect which occurs in the flash memory 11 can also be repaired. The remaining points are identical to those of the single chip microcomputer 1A of FIG. 1, and their detailed description will be omitted.

<<Third Single Chip Microcomputer>>

Figure 17:
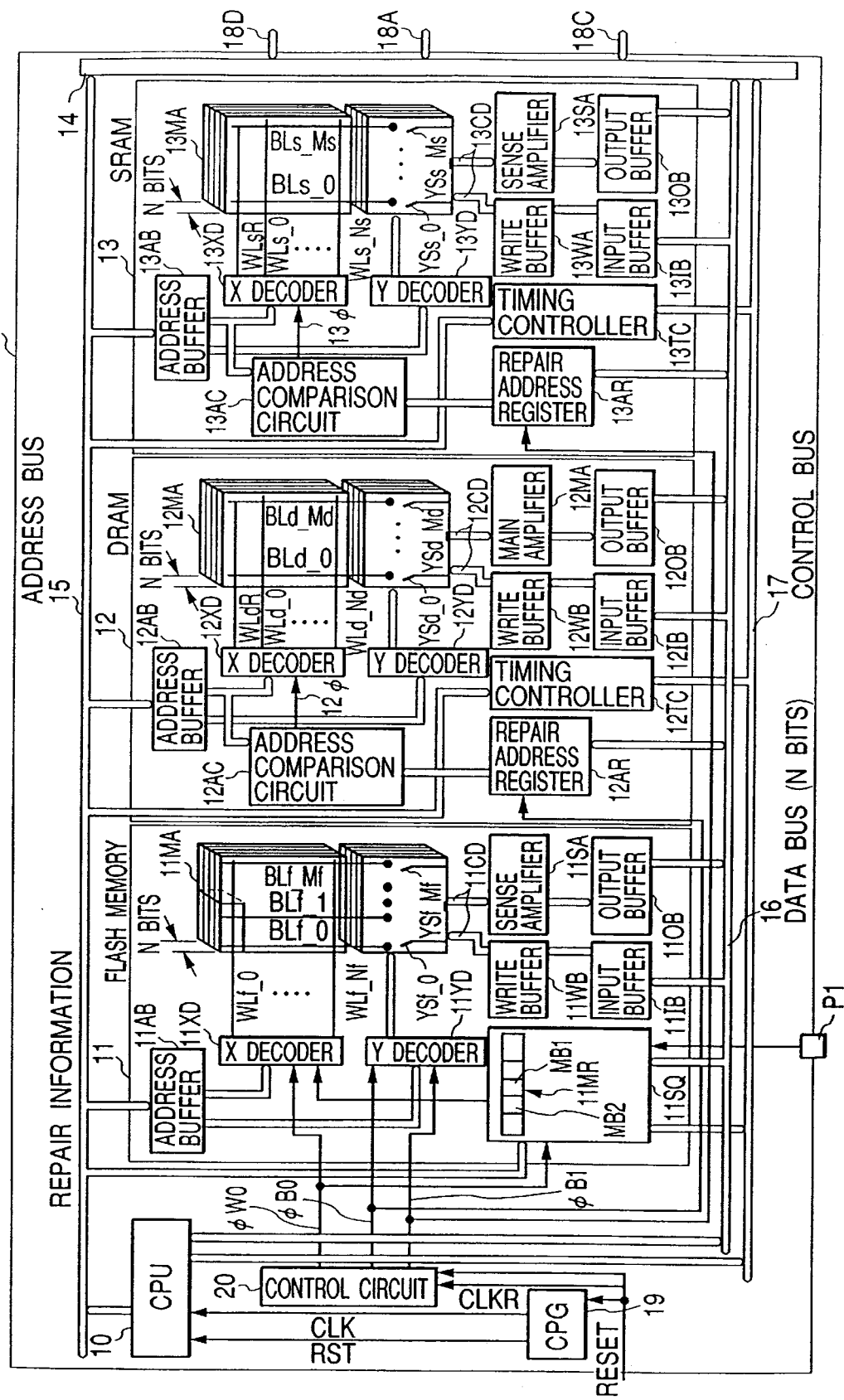
FIG. 17 is a block diagram showing a third single chip microcomputer representing still another embodiment of the semiconductor integrated circuit device according to the invention.

FIG. 17 shows a third single chip microcomputer representing still another embodiment of the semiconductor integrated circuit device according to the invention. The single chip microcomputer 1C, as shown in FIG. 17, is different from that of FIG. 1 in that the operation to read the repair information from the flash memory is performed in a plurality of cycles, and in that the data are consecutively latched for each read cycle of the repair information in a plurality of repair address registers. Specifically, the single chip microcomputer 1C is provided with a clock pulse generator (CPG) 19 and a control circuit 20 as the clock control circuit to be initialized in response to a reset instruction (or reset period) by the reset signal RESET.

Figure 18:
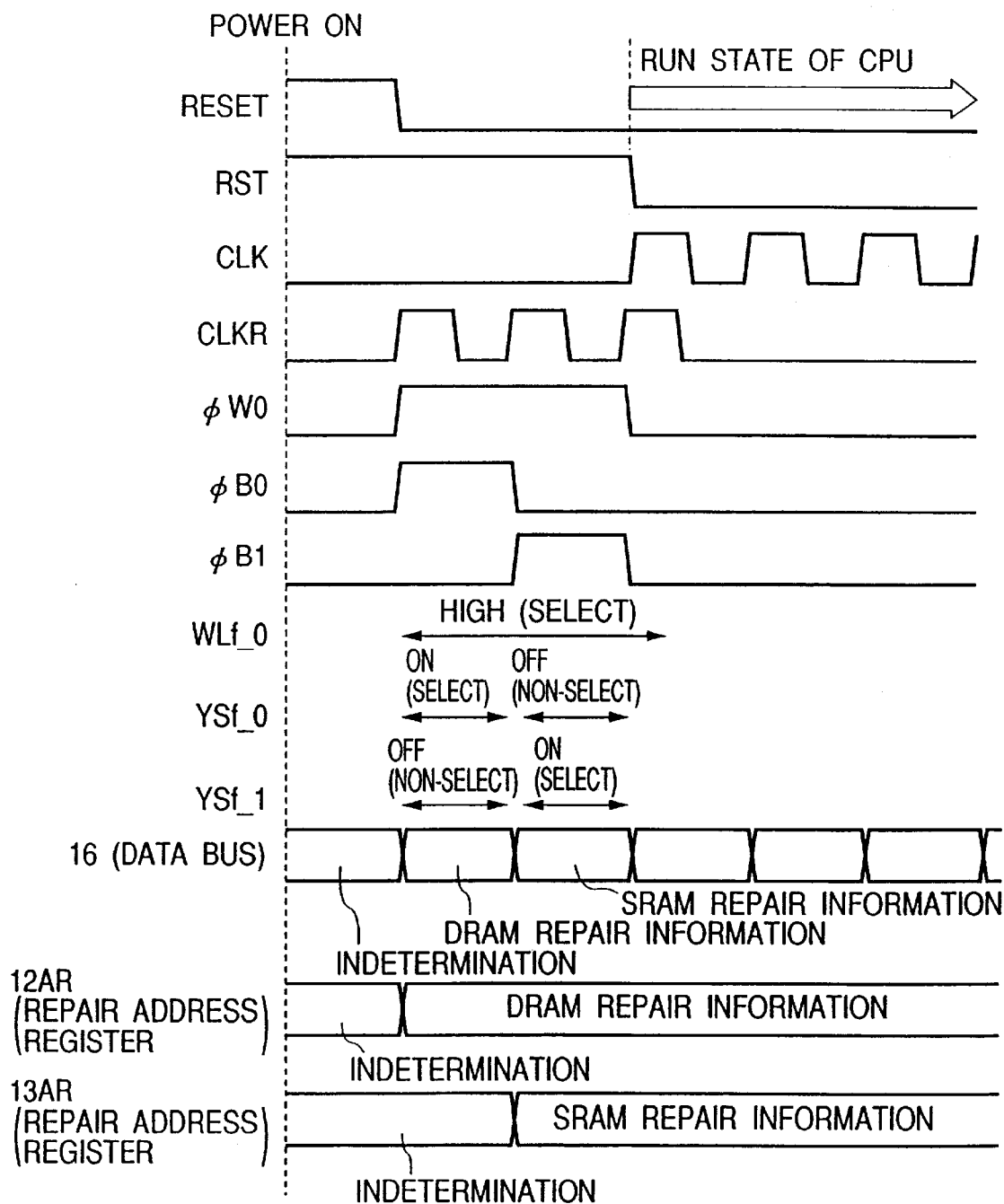
FIG. 18 is a timing chart showing one example of a process for initial programming of a reset period with the repair information in the third single chip microcomputer.

The clock pulse generator 19 is provided with an oscillation circuit using an oscillator and a frequency division circuit or a PLL circuit, for example. When the operating power is turned ON, the reset signal RESET is asserted, and the internal operations are stabilized for generating the clock signal. After this, the clock pulse generator 19 generates a clock signal CLKR in response to the negation of the reset signal RESET. As exemplified in FIG. 18, the clock signal CLKR is generated three times, although the invention is not especially limited thereto, and is fed to the control circuit 20. The CPU 10 is initialized with a reset signal RST which is generated by the clock pulse generator 19. The reset period of the CPU 10 continues till the third clock signal CLKR is generated, as exemplified in FIG. 18. When the reset period by the reset signal RST is ended, the CPU 10 starts the reset exceptional operation in synchronism with the clock signal CLK which is generated from the clock pulse generator 19.

For the reset period of the CPU 10 by the reset signal RST, the control circuit 20 performs the initial program control of the repair information. As exemplified in FIG. 18, more specifically, the control circuit 20 asserts a control signal φW0 for the periods of the first cycle and the second cycle of the clock signal CLKR, and asserts a control signal φB0 in response to the first cycle and a control signal φB1 in response to the second cycle. In response to the asserted period of the control signal φW0, the sequence controller 11SQ activates the sense amplifier 11SA and the output buffer 11OB to control the voltage of the flash memory in a readable manner. In response to the asserted period of the control signal φW0, the X decoder 11XD feeds the word line WLf_0 with the read select level. For the asserted period of the control signal φB0, the Y decoder 11YD selects the bit line BLf_0 by the Y selector YSf_0. As a result, for the asserted period of the control signal φB0 (or the first cycle of the clock signal CLKR), the repair information is read out to the data bus 16 from the memory cell of N bits, as located at the intersection between the word line WLf_0 and the bit line BLf_0. At this time, the control signal φB0 is fed to the repair address register 12AR of the DRAM 12, and the data of the data bus 16 are inputted for the high level period of the control signal φB0 and latched with the low level so that the repair information is latched in the repair address register 12AR. In the Y decoder 11YD, on the other hand, the bit line BLf_1 is selected by the Y selector YSf_1 for the asserted period of the next control signal φB1. As a result, for the asserted period of the control signal φB1 (or the second cycle of the clock signal CLKR), the repair information is read out to the data bus 16 from the memory cell of N bits, as located at the intersection between the word line WLf_1 and the bit line BLf_1. At this time, the control signal φB1 is fed to the repair address register 13AR of the SRAM 13, and the register 13AR inputs the data of the data bus 16 for the high level period of the control signal φB1 and latches the input data with the low level so that the repair information is latched in the repair address register 13AR.

If the repair information of the DRAM 12 is stored in the memory cell at the intersection between the word line WLf_0 and the bit line BLf_0, and if the repair information of the SRAM 13 is stored in the memory cell at the intersection between the word line WLf_0 and the bit line BLf_1, the repair information-can be internally transferred consecutively at the unit of N bits to the DRAM 12 and the SRAM 13 in response to the reset instruction of the single chip microcomputer 1C. The number of the internal transfers of the repair information to one circuit should not be limited to one time but can be suitably determined according to the redundancy logic scale proportional to the logic scale of that circuit. For example, the number of control signals to be fed to the Y decoder may be increased so that different Y selectors may be selected for the individual control signals, and the number of repair address registers of the circuit for receiving the repair information may be increased, if necessary. In the case of the construction described with reference to FIG. 1, the period for the initial programming operation of the repair information depends on the reset period of the reset signal RESET. When the amount of repair information to be initially programmed is large, the reset period by the reset signal RESET has to be controlled externally of the microcomputer. In the construction of FIG. 17, after the operation of the clock pulse generator 19 has stabilized with the reset signal RESET, the control circuit 20 in the microcomputer 1C controls the initial programming operation of the repair information autonomously, then no special operation is needed outside of the microcomputer even for much repair information to be initially programmed, so that the initial programming of the repair information can be ensured. The remaining points are identical to those of the single chip microcomputer 1A of FIG. 1, and their detailed description will be omitted.

In view of the large scale of integration as represented by the on-chip system, on the other hand, the stored information of the flash memory 11 is utilized for repairing a defect of the SRAM 13 or the DRAM 12 other than the flash memory 11 itself, so that the flash memory 11 or one circuit module packaged on a large-scale integrated circuit device may be efficiently utilized in relation to another circuit module. Moreover, the construction of the internal transfer of the repair information through the data bus 16 and the serial internal transfer, as divided into a plurality of cycles of the repair information, is important in that the operation to reflect the repair information on each of the SRAM 13 and the DRAM 12 in accordance with the increase in that information can be realized at a high speed when the repair information increases in proportion to the increase in the number of defects according to the large capacity of the SRAM 13, the DRAM 12 and so on.

<<Block Replacement>>

Figure 19:
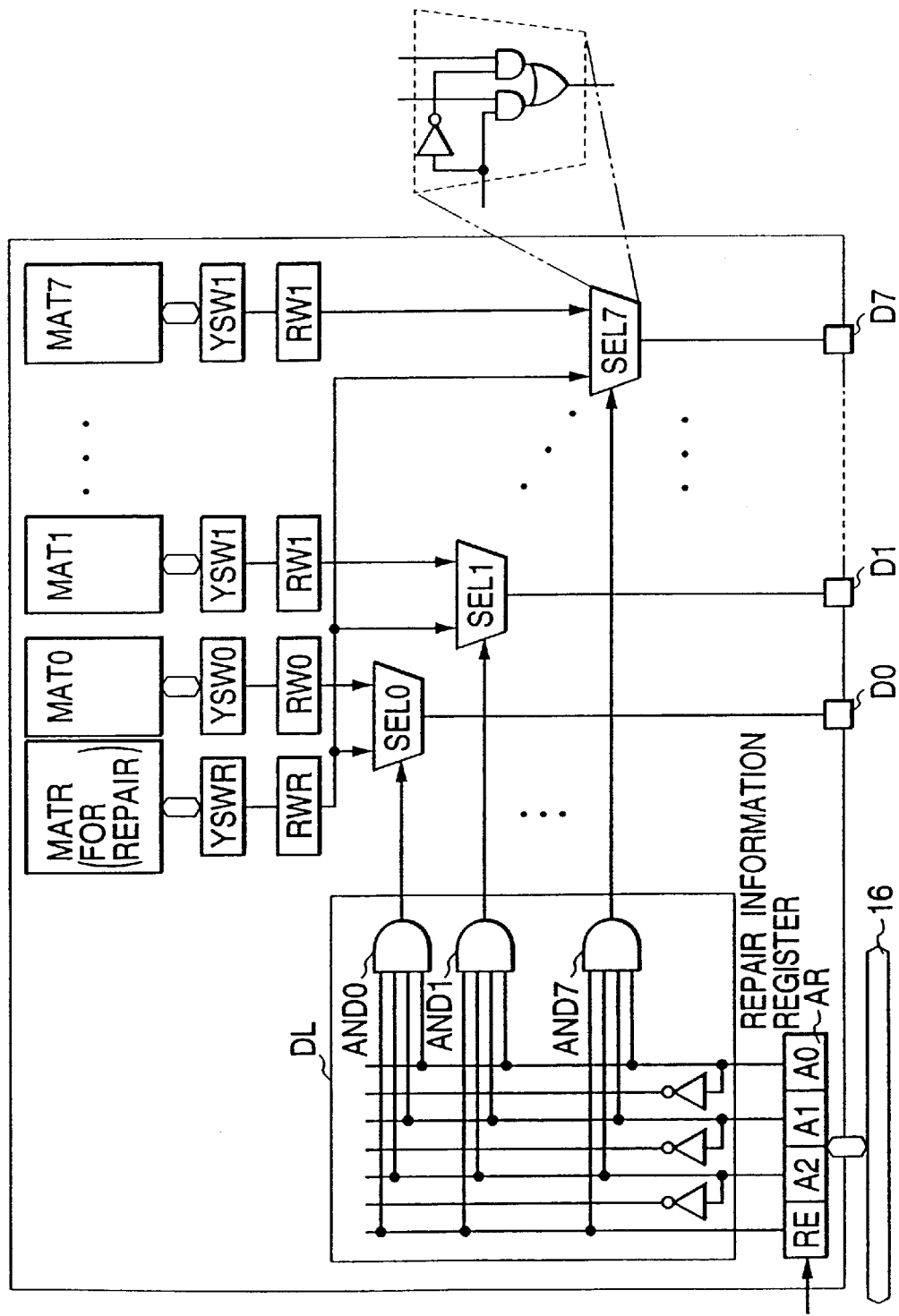
FIG. 19 is a block diagram schematically showing one example of a memory adopting a construction in which the defect repair is performed by replacing a memory mat or a memory block.

The replacement into the redundancy, as has been described hereinbefore, is effected by address comparison, but can be effected by the replacement of the memory mat or memory block, as exemplified in FIG. 19. For example, memory mats MAT0 to MAT7 are memory blocks, in which the normal memory cells are arranged in a matrix. In this example, there are assigned to each memory block data input/output terminals D0 to D7 of 1 bit, between which are arranged Y selector circuits YSW0 to YSW7 and read/write circuits (e.g., sense amplifiers and write amplifiers) RW0 to RW7 and so on. There is provided a redundancy memory mat MATR in which defect repairing memory cells are arranged in the form of a matrix, and with which are connected a redundancy Y selector circuit YSWR and a read/write circuit RWR. The memory mats MAT0 to MAT 7 and the redundancy memory mat MATR have mutually identical circuit constructions. The Y selector circuits YSW0 to YSW7 and YSWR select either one bit line or one pair of complementary bit lines from the corresponding memory mats.

In order that one of the memory mats MAT0 to MAT7 may be replaced by the redundancy memory mat MATR, there are provided selectors SEL0 to SEL7. These selectors SEL0 to SEL7 select either the input/output terminals of the read/write circuit RWR or the input/output terminals of the read/write circuits RW0 to RW7 and connect the selected ones with the data input/output terminals D0 to D7. The select control signals for the selectors SEL0 to SEL7 are generated by a decoder DL, to which the repair information is fed from a repair information register AR. The initial programming method of the repair information is identical to this one.

According to the example of FIG. 19, the repair information includes a repair enable bit RE and select bits A2 to A0 of 3 bits. The decoder DL is constructed to include AND gates AND0 to AND7 constituting decode logics for the complementary signals of the select bits A2 to A0, and the outputs of the AND gates AND0 to AND7 are fed to the select terminals of corresponding selectors SEL0 to SEL7. Each of the AND gates AND0 to AND7 is fed with the repair enable bit RE and can perform the decode operation when it is brought into the repair enable state at the logic value "1". In other words, with the repair enable bit RE being at the logic value "0", all the output select signals of the individual AND gates AND0 to AND7 are forced to the non-select level.

If the repair is performed by the replacement of the memory mat or the memory block, the address comparing operation is not needed so that the access time can be shortened. On the other hand, the bit number of the repair information can be reduced for the repairable scale. This is suitable for the case of a large capacity DRAM. However, the chip area to be occupied by the redundancy is larger than that of the construction of the address comparison. The construction of FIG. 19 can be applied to any of the SRAM 13, the DRAM 12 and the flash memory 11.

<<Application to Trimming Circuit>>

The description thus far has been directed to a case in which the repair information for the redundancy is stored for use in the flash memory 11. The trimming information can be stored for use in place of or together with the repair information. Here will be described several examples of a circuit capable of determining the circuit characteristics by using trimming information.

Figure 20:
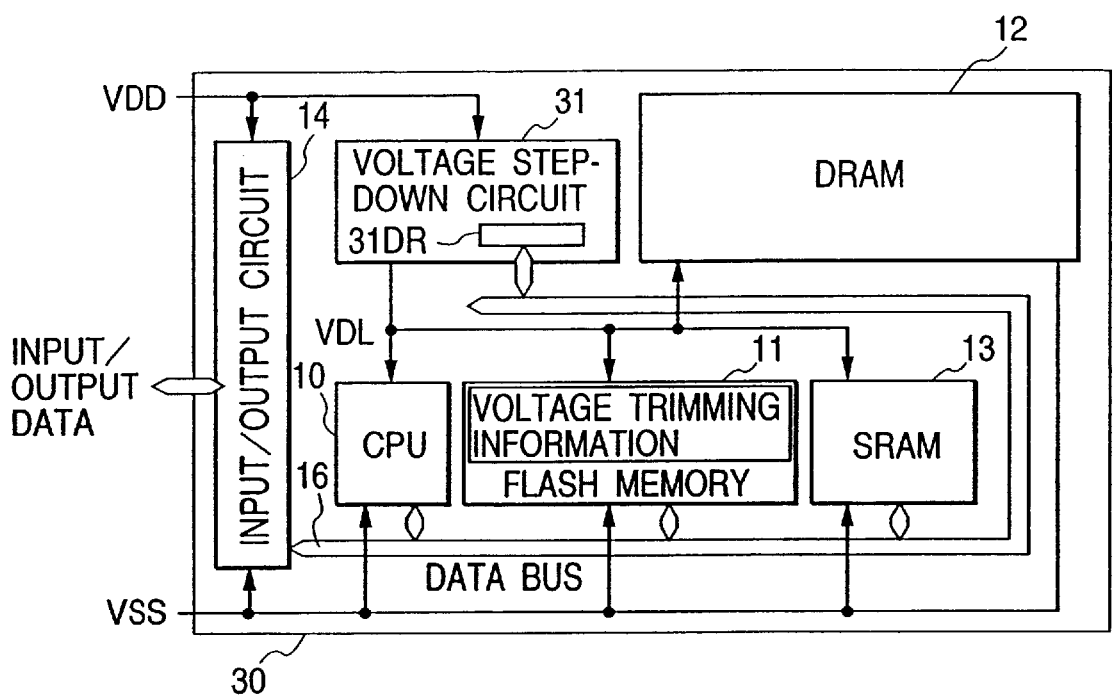
FIG. 20 is a block diagram showing one example of a single chip microcomputer having a voltage step-down circuit.

FIG. 20 shows one embodiment of the single chip microcomputer having a voltage step-down circuit. This voltage step-down circuit 31 steps down the power voltage VDD at 5 v or 3.3 V, as fed from the outside of a single chip microcomputer 30, to generate an internal power voltage VDL. The internal power voltage VDL thus stepped down is used as the operating power such as for the CPU 10, the flash memory 11, the DRAM 12, the SRAM 13 and so on. The reason for using this step-down voltage VDL is to warrant the reliability of the circuit operations and to realize a low power consumption when the circuit elements are miniaturized for improving the integration and the operating speed. The input/output circuit 14 to be interfaced with the outside uses the external power voltage VDD as its operating power. Letters VSS designate the earth side of the circuit. This voltage step-down circuit 31 is provided with a voltage trimming register 31DR for latching the control information (or voltage trimming information) to determine the reference voltage for specifying the level of the internal power voltage VDL. In the initial programming of this register 31DR with the voltage trimming information, as in the foregoing initial programming with the repair information, the voltage trimming information is read out from the flash memory 11 to the data bus 16 in response to the reset instruction so that the read voltage trimming information is latched in the register 31DR.

Figure 21:
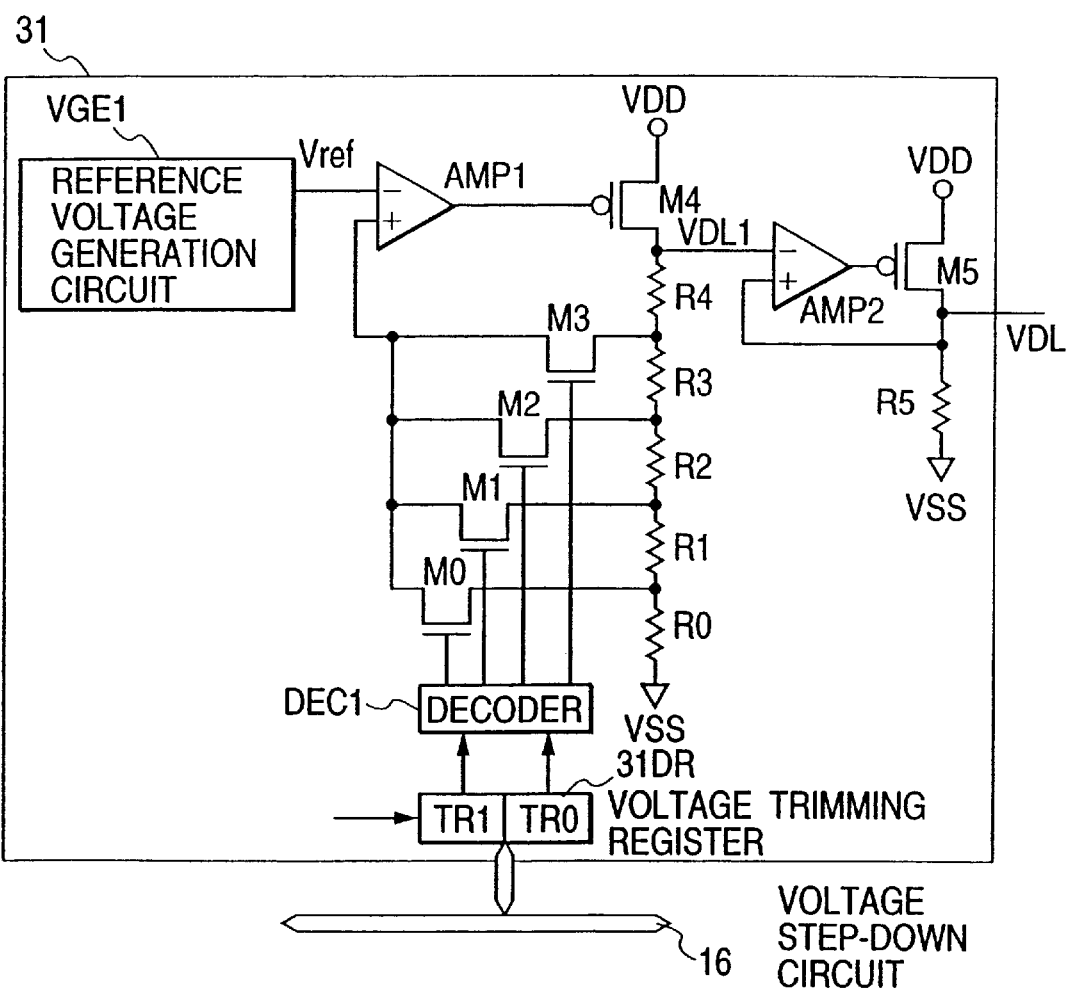
FIG. 21 is a circuit diagram showing one example of the voltage step-down circuit.

FIG. 21 shows one example of the voltage step-down circuit 31. The step-down voltage is outputted rom a source follower circuit which is constructed to include an n-channel MOS transistor M5 and a resistance element R5. The conductance of the transistor M5 is subjected to a negative feedback control by an operation amplifier AMP2. The voltage VDL is logically equalized to a control voltage VDL1. This control voltage VDL1 is outputted from a source follower circuit which is constructed to include an n-channel MOS transistor M4 and resistance elements R0 to R4. The conductance of the transistor M4 is subjected to a negative feedback control by an operation amplifier AMP1. This feedback line is provided with switch MOS transistors M0 to M3 capable of selecting the resistance voltage division ratio by the resistors R0 to R4 to construct a trimming circuit. The selection of the switch MOS transistors M0 to M3 is performed by a decoder DEC1 for decoding voltage trimming information TR1 and TR0 of 2 bits. The feedback voltage thus generated is compared in the operational amplifier AMP1 with a reference voltage which is generated in a reference voltage generation circuit VGE1. This amplifier AMP1 performs the negative feedback control to equalize the control voltage VDLI to a reference voltage Vref.

When the element characteristics of the voltage step-down circuit 31 are dispersed relatively largely by the influence of the process, the resistance voltage division ratio to be selected by the decoder DEC1 is so changed that the internal power voltage VDL1 may fall within a desired design range. The information for this can be obtained in advance from the circuit characteristics which are determined by the device test, and may be programmed in advance in the EPROM writer mode in a predetermined region (i.e., a predetermined address area corresponding to the repair information storing region) of the flash memory 11, as described hereinbefore. When the microcomputer 30 is reset, its voltage trimming information TR0 and TR1 are initially loaded in the voltage trimming register 31DR from the flash memory 11.

Figure 22:
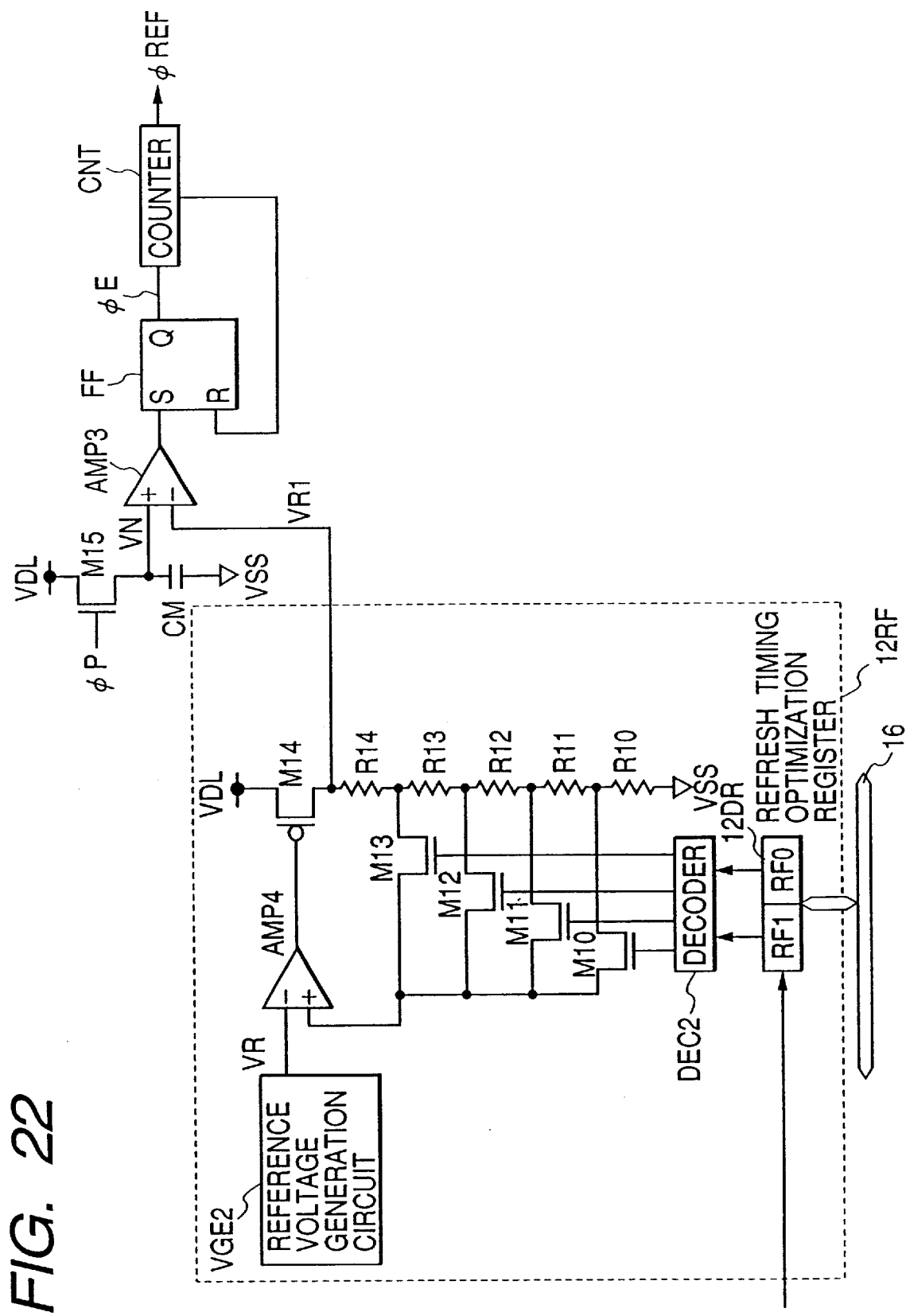
FIG. 22 is a circuit diagram showing one example of a refresh timer for controlling the refresh interval of a memory cell in a data holding mode of a DRAM 12.
Figure 23:
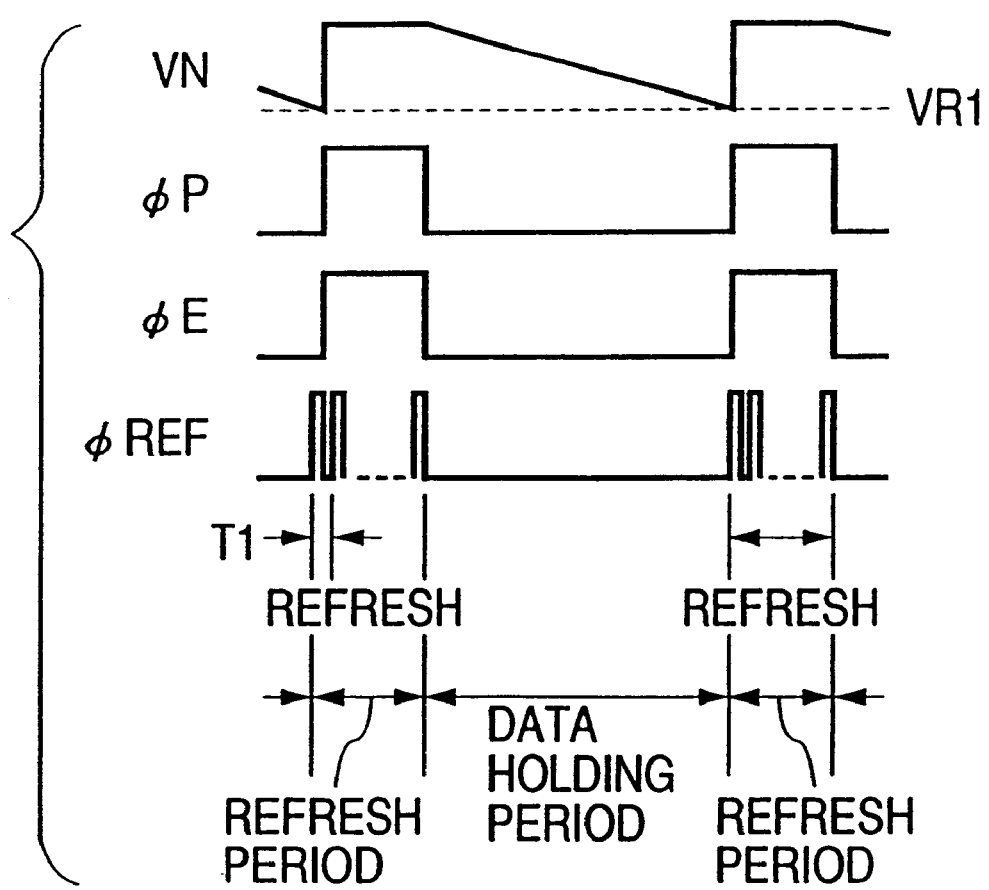
FIG. 23 is a timing chart showing one example of the operations of the refresh timer exemplified in FIG. 23.

FIG. 22 shows one example of a refresh timer for controlling the refresh interval of the memory cells in the data holding mode of the DRAM 12. Letters CM designate a monitoring storage capacitor which is designed to have a slightly shorter data holding time than that of the storage capacitor of the dynamic memory cell. An n-channel MOS transistor M15 is a charging transistor for the monitoring storage capacitor CM. This transistor M15 is turned ON for a refreshing operation period and OFF for a data holding period, as exemplified in FIG. 23. For the data holding period, the level of a voltage at a node VN is lowered by the leakage of the monitoring storage capacitor CM. The degree of this level down is detected by a comparator AMP3. This comparator AMP3 outputs a high level when the level of the node VN becomes lower than a reference voltage VR1. This state sets a set/reset type flip-flop FF. As a result, a counter CNT starts its counting operation to generate a refresh clock φREF. In synchronism with this refresh clock φREF, the refreshing operation is performed. For example, the refreshing operation at the unit of word line is performed in synchronism with the clock, cycle of the refresh clock φREF while sequentially incrementing the not-shown refresh address counter. By the carry due to the overflow of the counter CNT the flip-flop FF is reset to end the series of refreshing operations. During this refreshing operation, the transistor M15 is kept ON, and the monitoring storage capacitor CM is charged for detecting the subsequent refresh timing. When the refreshing operation is ended, the transistor M15 is cut off to perform the refresh timing detection again by the leakage.

There is a fear that the charge holding characteristics of the monitoring storage capacitor CM will be fluctuated by the influence of the process. In the case of the average charge holding characteristics of the storage capacitor of the normal memory cells of the DRAM, for example, data errors or data breakages occur in many memory cells of the charge holding characteristics. In accordance with the charge holding performance of the monitoring storage capacitor CM, therefore, it is possible to adopt a reference voltage generation circuit 12RF capable of adjusting the reference voltage VR1.

In this reference voltage generation circuit 12RF, as exemplified in FIG. 22, an output is made by a source follower circuit which is constructed to include an n-channel MOS transistor M14 and resistance elements R10 to R14. The conductance of the transistor M14 is subjected to a feedback control by an operation amplifier AMP4. This feedback line is provided with switch MOS transistors M10 to M13 capable of selecting the resistance voltage division ratio by the resistors R10 to R14, to construct a trimming circuit. The selection of the switch MOS transistors M10 to M13 is performed by a decoder DEC2 for decoding voltage trimming information RF1 and RF0 of 2 bits. The feedback voltage thus generated is compared in the operational amplifier AMP4 with a reference voltage VR which is generated by a reference voltage generation circuit VGE2. This amplifier AMP4 performs a negative feedback control so as to equalize the reference voltage VR1 to the reference voltage VR.

When the charge holding performance of the monitoring storage capacitor CM is fluctuated over the allowable range by the influence of the manufacturing process, the resistance voltage division ratio to be selected by the decoder DEC2 is suitably changed. The information for this change can be obtained in advance from the charge holding performance of the capacitor CM, as determined from the device test, and may be programmed in advance in the EPROM writer mode in a predetermined range (i.e., a predetermined address area corresponding to the storage region of the repair information) of the flash memory 11, as described hereinbefore. When the microcomputer 30 is reset, its voltage trimming information TR0 and TR1 are initially loaded in a refresh timing optimization register 12DR from the flash memory 11.

Figure 24:
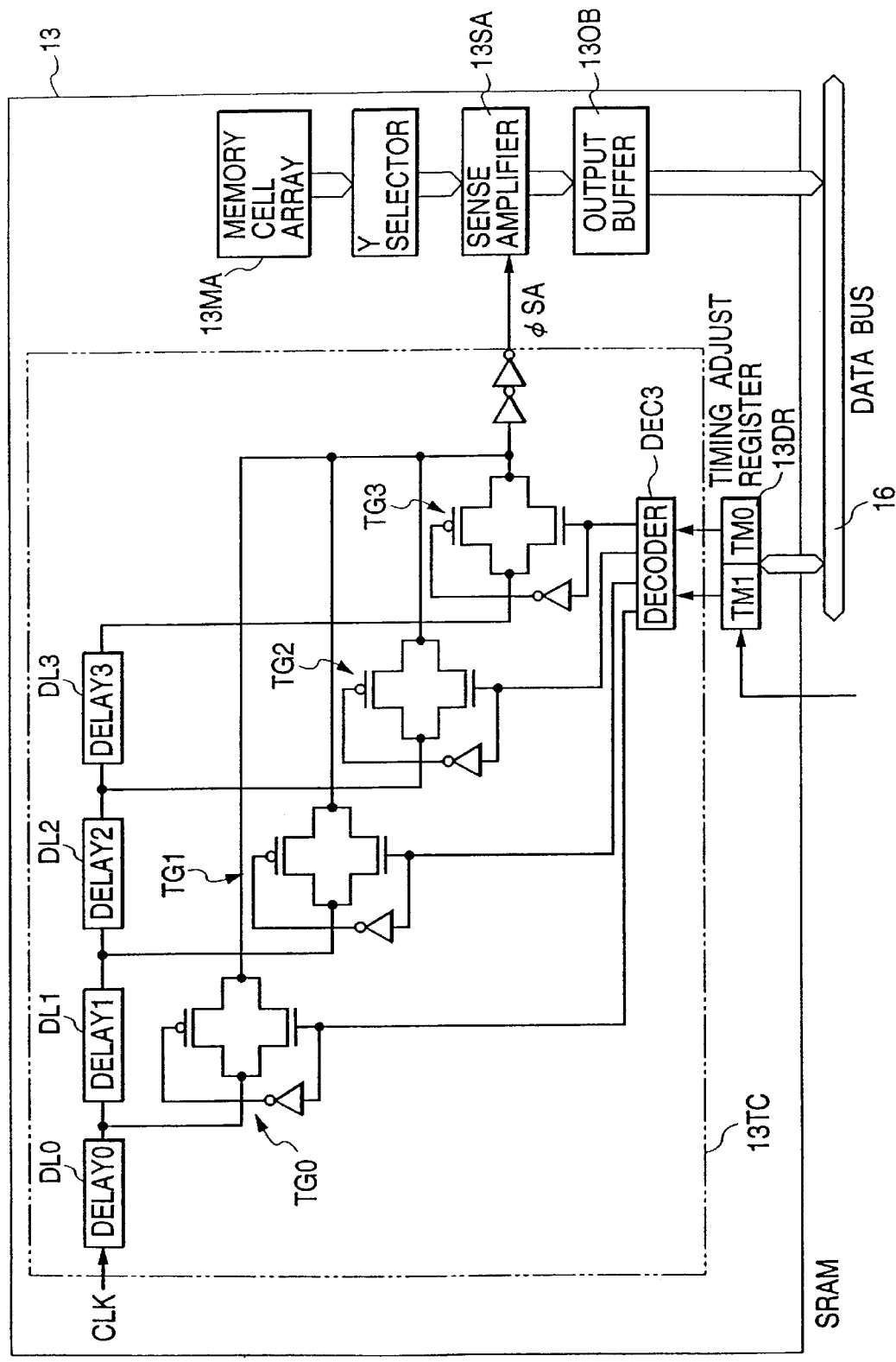
FIG. 24 is a circuit diagram showing one example of a timing adjustment circuit of a sense amplifier activation signal in a timing controller of a SRAM 13.

FIG. 24 shows a delay circuit for delay of a sense amplifier activation signal φSA representing one example of the timing adjusting delay circuit in the timing controller 13TC of the SRAM 13. This timing controller 13TC is provided with delay circuits DL0 to DL3 of four serial stages, and CMOS transfer gates TG0 to TG3 for selecting the outputs of the individual delay circuits DL0 to DL3. The outputs of the CMOS transfer gates TG0 to TG3 are wired OR so that the signal at their coupling node is fed as a sense amplifier activation signal φSA to the sense amplifier 13SA. Which one of the CMOS transfer gates TG0 to TG3 is to be turned ON is determined by a decoder DEC3 for decoding timing adjustment information TM0 and TM1 of 2 bits.

When the accessing speed of the SRAM 13 is fluctuated by the influence of the manufacturing process, it may be not desirable to adjust the activation timing of the sense amplifier accordingly, than to acquire a fast access or to stabilize the data reading operation. It is arbitrary to determine the selected state of the CMOS transfer gates TG0 to TG3 accordingly. The information for this can be obtained in advance from the accessing speed performance which is grasped by the device test, and may be programmed in advance in the EPROM writer mode in a predetermined region (i.e., a predetermined address area corresponding to the repair information storing region) of the flash memory 11, as described hereinbefore. When the microcomputer 30 is reset, its items of timing adjustment information TMO and TMI are initially loaded in the timing adjustment register 13DR from the flash memory 11 through the data bus 16 by the same procedure as that of the repair information.

Figure 25:
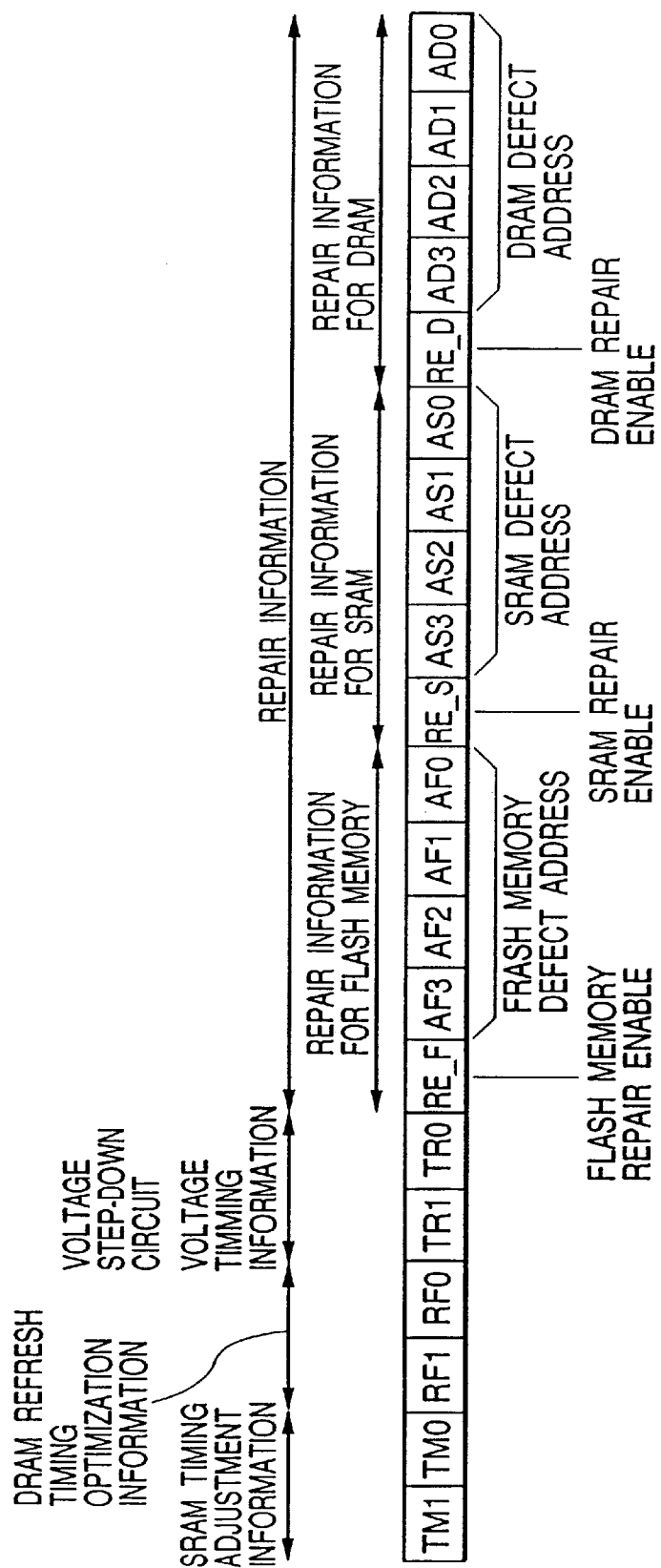
FIG. 25 is a diagram showing one example of a format of the initialization data which are stored in the flash memory when the techniques individually explained in the defect repair of FIG. 14, the voltage trimming of FIG. 21, the refresh interval optimization of FIG. 22 and the timing adjustment of the timing controller of FIG. 24 are applied in, connection with one single chip microcomputer exemplified in FIG. 20.

The techniques, as individually described in connection with the defect repair of FIG. 14, the voltage trimming of FIG. 21, the optimization of the refresh inverter of FIG. 22, and the timing adjustment of the timing controller of FIG. 24, can be applied altogether to the semiconductor integrated circuit device such as the one single chip microcomputer 30, as exemplified in FIG. 20. At this time, the information to be stored in the flash memory 11 can be positioned as initialization data for determining the partial function of the circuit, and is stored with the format of FIG. 25, for example, in the memory cell array 11MA of the flash memory 11.

Figure 26:
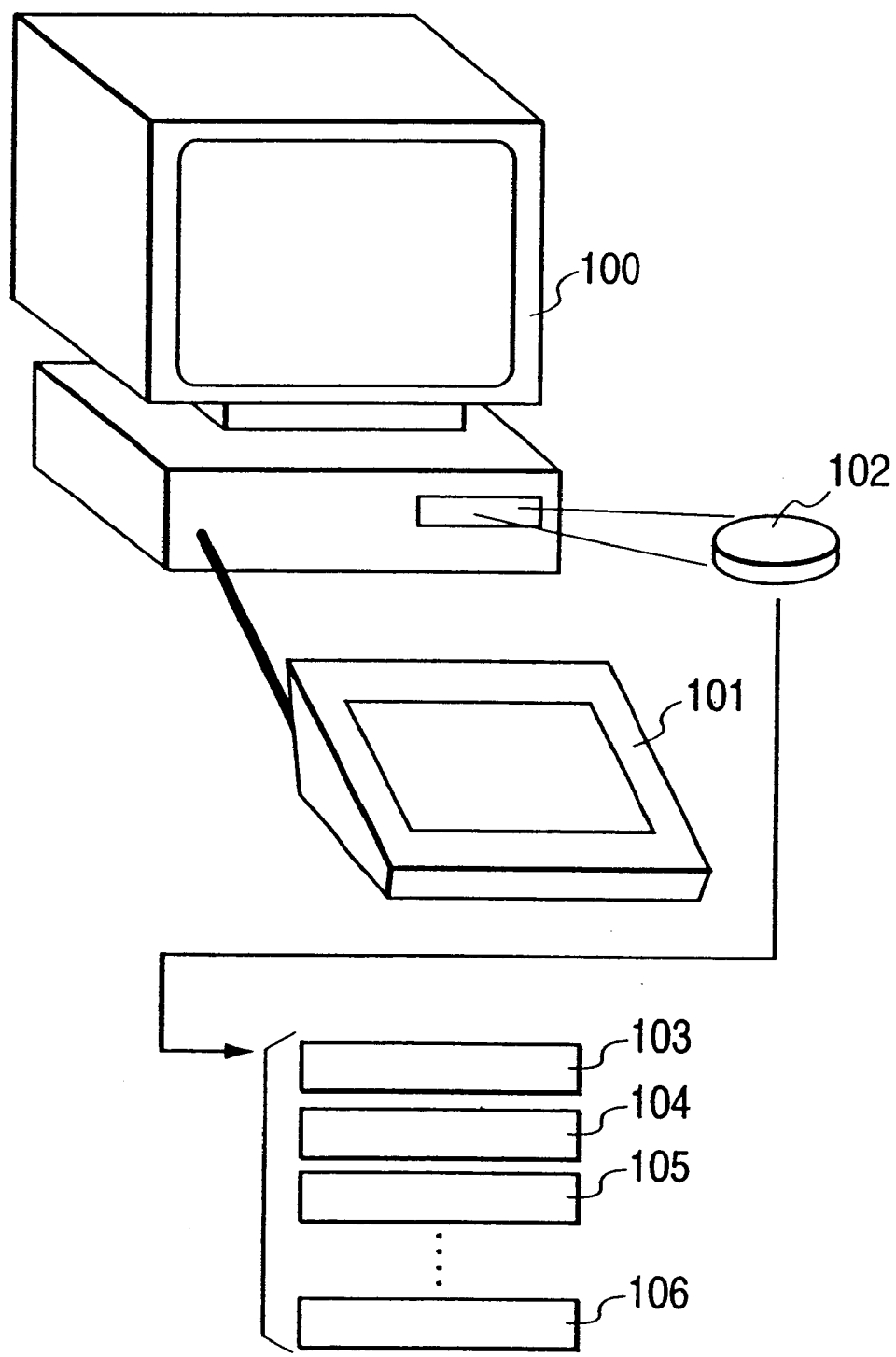
FIG. 26 is a conceptional diagram showing one example of a system for designing a semiconductor integrated circuit device according to the invention by using a computer.

FIG. 26 shows one example of a system for designing a semiconductor integrated circuit device by using a computer.

In FIG. 26, reference numeral 100 designates a computer (or an electronic computer) such as a personal computer, and numeral 101 designates a keyboard for inputting data in the electronic computer. On the other hand, numeral 102 designates a recording medium, such as a floppy disk.

This recording medium is recorded in advance with data necessary for designing the semiconductor integrated circuit device. In order to design the semiconductor integrated circuit device shown in FIG. 1, for example, the recording medium 102 stores data 103 for determining the construction of the flash memory (11); data 104 for determining the construction of the DRAM (12); data 105 for determining the construction of the repair address register (12AR); and data 106 for determining the construction of the data bus (16).

A semiconductor integrated circuit device can be designed on the electronic computer by reading out the data necessary for an objective to be designed, to the electronic computer from the recording medium.

The individual data may be exemplified by the programs (e.g., the RTL (Register Transfer Level) model or the HDL (Hardware Description Language) model) which are programmed in such specific computer languages as can be understood by the electronic computer, or the data (e.g., coordinate data or connecting/wiring data) on the mask to be actually used for manufacturing the semiconductor integrated circuit device. Of course, the combination of these two may be used as the data.

In the description thus far made, the data for determining the construction of the repair address register is the data 105. However, it is quite natural that the construction of the register (e.g., the voltage trimming register shown in FIG. 20, the refresh timing optimization register shown in FIG. 22, the timing adjustment register shown in FIG. 24, or their composite register shown in FIG. 25) to be used for changing the electric characteristics may be determined by the data 105.

On the other hand, in the description concerning FIG. 1, the repair address register (12AR) and the address comparison circuit (12AC) are provided in the DRAM (12). These may be exemplified by the data 105 other than the data 104 for determining the construction of the DRAM (e.g., the memory array 12MA, the decoders 12XD and 12YD, the Y selector, the write buffer, the input buffer, the main amplifier or the output buffer). Of course, the DRAM (12) shown in FIG. 1 may be handled as one data group.

Although the invention made by us has been specifically described in connection with various embodiments, it should not be limited to the embodiments but could naturally be modified in various manners without departing from the gist thereof.

For example, the semiconductor integrated circuit device according to the invention should not be limited to a single chip microcomputer, and the kind of packaged circuit module of the single chip microcomputer should not be limited to the examples but can be suitably modified. On the other hand, the electrically reprogrammable nonvolatile memory should not be limited to a flash memory, but may adopt memory cells which include select MOS transistors and MNOS (Metal Nitride Oxide Semiconductor) storage transistors. On the other hand, the voltage applied states for programming and erasing the flash memory should not be limited to the ones described, but could be suitably modified. On the other hand, the nonvolatile memory may store information of multiple values such as four or more values. On the other hand, the volatile memory should not be limited to the SRAM or the DRAM but may be exemplified by a ferroelectric memory.

In a memory such as a DRAM, SRAM or flash memory, the redundancy word line is selected according to the address comparison result obtained by the address comparison circuit so that its select timing is liable to be delayed more than that of the normal word line. The timing delay of this kind cannot be neglected especially when the semiconductor integrated circuit device operates in a seriously quick operation cycle. For this case, if a slight increase in the area is allowed, the size of the information storing capacitor in the redundancy dynamic memory cell can be made larger than that of the normal memory cell, or the transistor in the redundancy static memory cell or the flash memory cell can be enlarged in size to augment its conductance. In this case, more specifically, the amount of the read signal to be fed from the selected redundancy memory cell to the bit line can be augmented so that the normal data read can be effected even if the read sense operation timing is accordingly accelerated. As a result, the influence due to the delay in the select timing of the redundancy word line can be substantially lightened by the speed-up of the sense operation after the memory cell was selected.

The adjusting technique for adjusting the refresh period of the DRAM, as has been described with reference to FIG. 22, can be modified. When the data holding time characteristics of several dynamic memory cells are shifted relatively largely with respect to the charge voltage holding characteristics of the capacitor CM of FIG. 22, the reference voltage VR1 of FIG. 22 can be so positively modified that the refreshing operations may be repeated for the normal operation period of those dynamic memory cells. The trimming for warranting the refreshing operation of the DRAM can be adopted, and, in place of the construction of FIG. 22, a construction in which the counted number of a counter or timer for counting the clock signals, such as the system clock signals of the semiconductor integrated circuit device, to generate the refresh timing signal is changed. On the other hand, the invention is highly effective when applied to an on-chip system LSI, but could naturally be applied to a logic LSI other than a system LSI. In FIGS. 1, 14 or 15, moreover each memory module 11, 12 or 13 has been described to include one redundancy word line, but the number may be plural. With this plurality, it is possible not only to improve the repairing efficiency but also to repair a defect which is detected at each of the defect repairing steps S2, S7 and S10, as shown in FIG. 14(A).

The effects to be obtained by the representative features of the invention disclosed herein will be briefly described in the following.

Specifically, the fuse program circuit for a coupling change such as a defect repair can be eliminated, and an apparatus or step for a fusing treatment can be omitted, so that the testing cost can be lowered. Since a laser-fusing opening need not be formed even for a process such as a copper wiring process, moreover, the process of manufacture is simplified Since the coupling control information for the nonvolatile memory can be reprogrammed, it is possible to sufficiently satisfy a demand for a coupling change against either a defect which occurs at a later step such as the burn-in step in the manufacturing process or a defect which occurs after the packaging over the system or the circuit substrate.

This makes it possible to efficiently change the coupling between the control processing unit such as the central processing unit and a circuit having a large-scale logic construction on which a volatile memory is mounted together with a nonvolatile memory. As a result, the yield of the semiconductor integrated circuit device having a large-scale logic can be improved to realize a cost reduction.

Especially, in view of the large scale of the system on-chip, in order to utilize the nonvolatile memory mounted on the large-scale integrated circuit efficiently in relation to another circuit module, the stored information of the nonvolatile memory is utilized for changing the coupling of the volatile memory, other than the nonvolatile memory. However, the means for the transfer of the coupling control information through the data bus and the series transfer of the plurality of cycles of the coupling control information is excellent in that, when the possibility of a coupling change increases according to the larger capacity of the volatile memory, the process to reflect the control information on the individual volatile memories in accordance with the increase in the amount of control information can be realized at a high speed.

What is claimed is:

1. A semiconductor integrated circuit device comprising, over one semiconductor substrate while sharing a data bus: a central processing unit; a nonvolatile memory which may be electrically reprogrammed and accessed by said central processing unit; and a volatile memory which may be accessed by said central processing unit, wherein said nonvolatile memory and said volatile memory individually include register means having data input terminals connected with said data bus, so that their functions are partially determined according to the information set in said register means, wherein said nonvolatile memory includes as plurality of nonvolatile memory cells, some of which are nonvolatile memory cells for storing initialization data, and has an operation mode for allowing the initialization data storing nonvolatile memory cells to be reprogrammed, and an operation mode for inhibiting the same, so that initialization data is read out from the nonvolatile memory cells and outputted in response to an instruction to initialize said semiconductor integrated circuit device, and wherein said register means latches initialization data from said nonvolatile memory in response to the instruction to initialize said semiconductor integrated circuit device.

2. A semiconductor integrated circuit device according to claim 1, further comprising a clock control circuit adapted to be initialized in response to a first state of a reset signal for indicating initialization of the semiconductor integrated circuit, wherein said clock control circuit outputs a first timing signal having a plurality of phases, shifted in activation timing from one another, in response to a change of said reset signal from the first state to a second state, and then outputs a second timing signal for causing said central processing unit to start a reset exceptional operation, wherein said nonvolatile memory reads out and outputs said initialization data consecutively in a plurality of cycles from the nonvolatile memory cells in response to the activation timing of said first timing signal, and wherein said register means latches the data bus consecutively for individual reading cycles of said initialization data from the nonvolatile memory.

3. A semiconductor integrated circuit device according to claim 1, wherein said volatile memory utilizes information latched by corresponding register means, as repair information for repairing defective normal volatile memory cells by replacing them with redundancy volatile memory cells.

4. A semiconductor integrated circuit device according to claim 1, wherein said nonvolatile memory utilizes information latched by corresponding register means, as repair information for repairing defective normal nonvolatile memory cells by replacing them with redundancy nonvolatile memory cells.

5. A semiconductor integrated circuit device according to claim 1, wherein said volatile memory includes dynamic memory cells as the volatile memory cells so that information latched by said register means corresponding to said volatile memory is utilized as control information for specifying a refresh interval of said dynamic memory cells.

6. A semiconductor integrated circuit device according to claim 1, wherein said volatile memory utilizes information latched by corresponding register means, as control information for specifying the timing of an internal control signal.

7. A semiconductor integrated circuit device according to claim 1, further comprising an internal voltage generation circuit for generating an internal power voltage by inputting the power voltage of an external power supply, wherein said internal voltage generation circuit includes latch means for latching control information for determining a reference voltage for specifying the level of the internal power voltage, wherein said latch means latches a portion of the initialization data to be read out from said nonvolatile storage unit, as the control information.

8. A semiconductor integrated circuit device according to claim 1, wherein said nonvolatile memory is a flash memory, and wherein some of the nonvolatile memory cells store a program to be executed by said central processing unit.

9. A semiconductor integrated circuit device according to claim 1, wherein said volatile memory is a DRAM and work memory of said central processing unit.

10. A semiconductor integrated circuit device according to claim 1, wherein said volatile memory is a fast accessing memory including a SRAM.

* * * * *